(12) United States Patent
Koyama et al.

(10) Patent No.: US 8,816,484 B2
(45) Date of Patent: Aug. 26, 2014

(54) SEMICONDUCTOR DEVICE

(75) Inventors: Jun Koyama, Sagamihara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 475 days.

(21) Appl. No.: 12/068,398

(22) Filed: Feb. 6, 2008

(65) Prior Publication Data
US 2008/0191332 A1    Aug. 14, 2008

(30) Foreign Application Priority Data
Feb. 9, 2007 (JP) ................................. 2007-030491

(51) Int. Cl.
*H01L 23/02* (2006.01)
(52) U.S. Cl.
USPC ............... 257/679; 257/428; 257/E25.004; 257/E25.006; 257/499; 257/E29.323; 257/E23.064
(58) Field of Classification Search
CPC . H01L 23/5227; H01L 27/0203; H01L 27/12; H01L 27/1214; H01L 27/1266; H01L 27/13
USPC .......... 257/499, 679, 428, E25.004, E25.006, 257/E29.323, E23.064
See application file for complete search history.

(56) References Cited

U.S. PATENT DOCUMENTS

| | | | |
|---|---|---|---|
| 6,836,026 B1 * | 12/2004 | Ali et al. .................. | 257/786 |
| 7,061,083 B1 | 6/2006 | Usami et al. | |
| 7,307,006 B2 | 12/2007 | Okazaki et al. | |
| 7,368,318 B2 | 5/2008 | Yamazaki | |
| 7,767,516 B2 | 8/2010 | Aoki et al. | |

(Continued)

FOREIGN PATENT DOCUMENTS

| | | |
|---|---|---|
| EP | 1148440 | 10/2001 |
| JP | 2001-101370 A | 4/2001 |

(Continued)

*Primary Examiner* — Tom Thomas
*Assistant Examiner* — Benjamin Tzu-Hung Liu
(74) *Attorney, Agent, or Firm* — Eric J. Robinson; Robinson Intellectual Property Law Office, P.C.

(57) ABSTRACT

A semiconductor device, in which an integrated circuit portion and an antenna are easily connected, can surely transmit and receive a signal to and from a communication device. The integrated circuit portion is formed of a thin film transistor over a surface of a substrate so that the area occupied by the integrated circuit portion is increased. The antenna is provided over the integrated circuit portion, and the thin film transistor and the antenna are connected. Further, the area over the substrate occupied by the integrated circuit portion is 0.5 to 1 times as large as the area of the surface of the substrate. Thus, the size of the integrated circuit portion can be close to the desired size of the antenna, so that the integrated circuit portion and the antenna are easily connected and the semiconductor device can surely transmit and receive a signal to and from the communication device.

36 Claims, 26 Drawing Sheets

(56) References Cited

U.S. PATENT DOCUMENTS

| | | |
|---|---|---|
| 7,816,774 B2 * | 10/2010 | Dekker et al. ............... 257/679 |
| 7,838,993 B2 | 11/2010 | Aoki et al. |
| 7,858,451 B2 | 12/2010 | Maekawa et al. |
| 7,939,822 B2 | 5/2011 | Maekawa et al. |
| 8,207,533 B2 | 6/2012 | Maekawa et al. |
| 8,227,851 B2 | 7/2012 | Aoki et al. |
| 8,247,814 B2 | 8/2012 | Maekawa et al. |
| 8,575,618 B2 | 11/2013 | Maekawa et al. |
| 2006/0009251 A1 * | 1/2006 | Noda et al. ............... 455/550.1 |
| 2006/0068536 A1 * | 3/2006 | Yamazaki ............... 438/197 |
| 2006/0202269 A1 * | 9/2006 | Suzuki et al. ............... 257/347 |

FOREIGN PATENT DOCUMENTS

| | | | | |
|---|---|---|---|---|
| JP | 2003-216918 A | 7/2003 | | |
| JP | 2004-078991 | 3/2004 | | |
| JP | 2005-56221 | * 3/2005 | ............ H01L 25/00 |
| JP | 2005-183741 A | 7/2005 | | |
| JP | 2006-121060 A | 5/2006 | | |
| JP | 2006-245557 A | 9/2006 | | |
| JP | 2006-270072 A | 10/2006 | | |
| JP | 2007-012042 A | 1/2007 | | |
| JP | 2007-013943 A | 1/2007 | | |
| WO | WO-2006/129775 | 12/2006 | | |
| WO | WO-2006/129817 | 12/2006 | | |

* cited by examiner

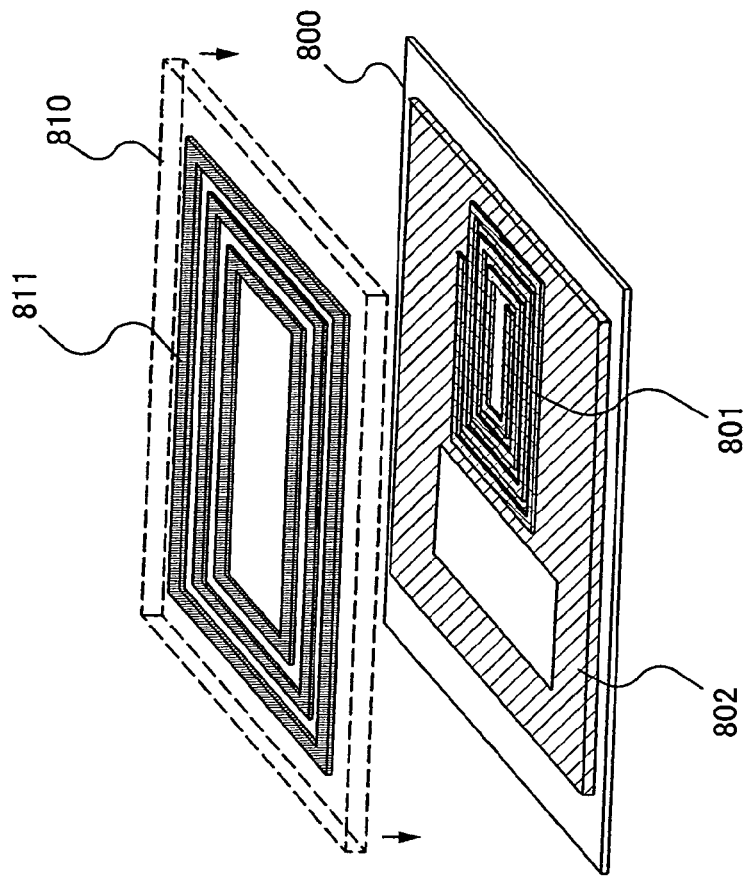
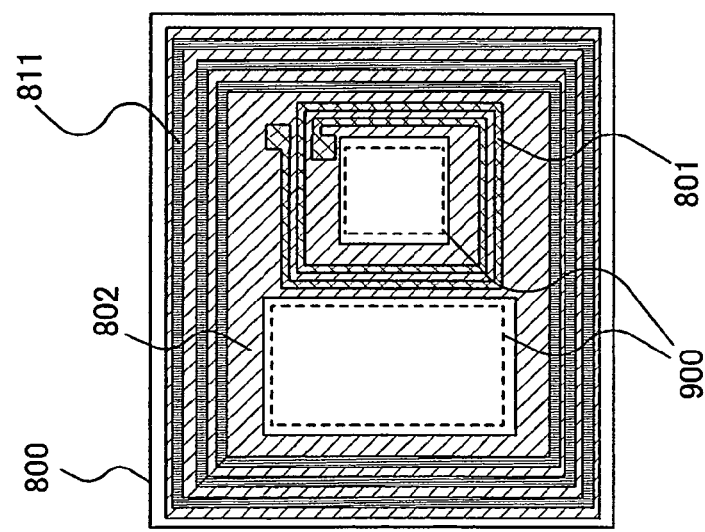

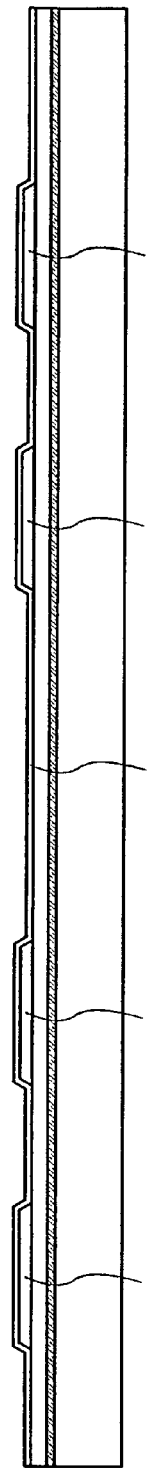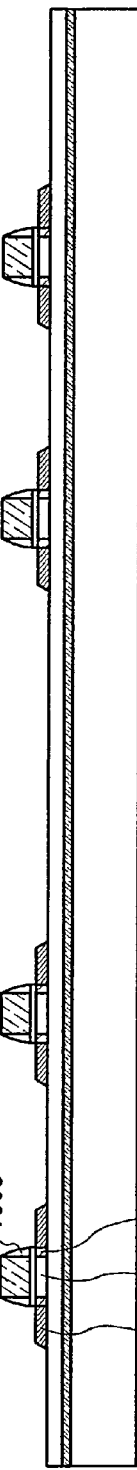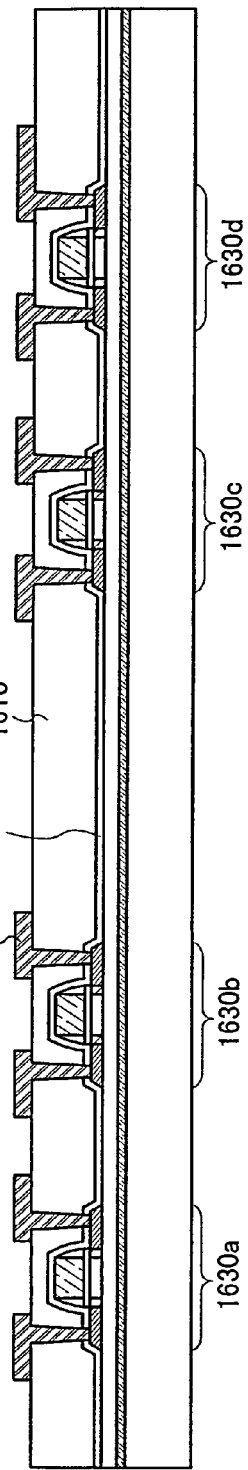
FIG. 18A
FIG. 18B
FIG. 18C
FIG. 18D

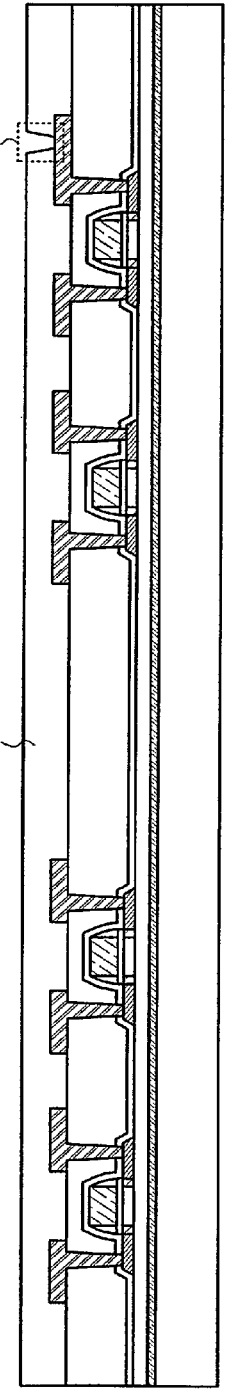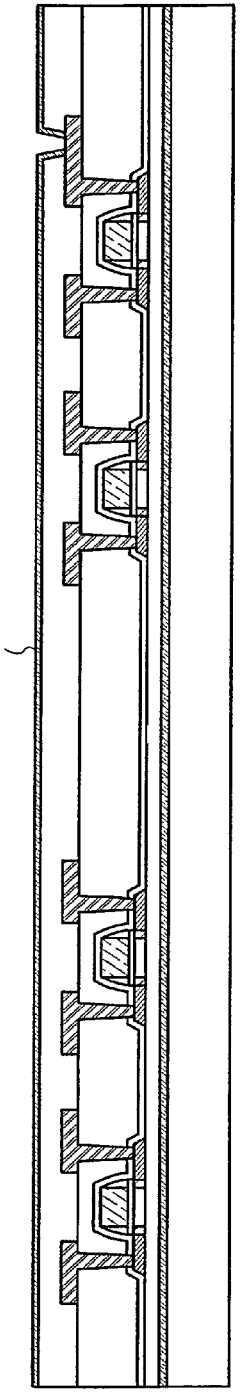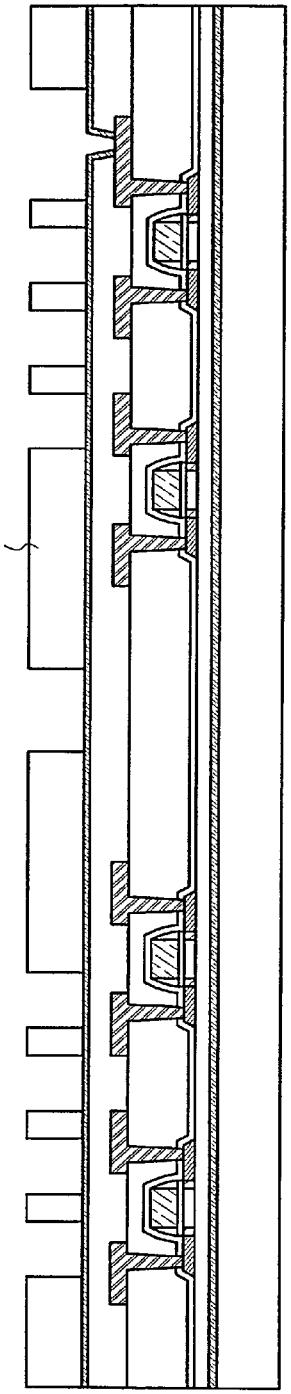
FIG. 19A
FIG. 19B
FIG. 19C

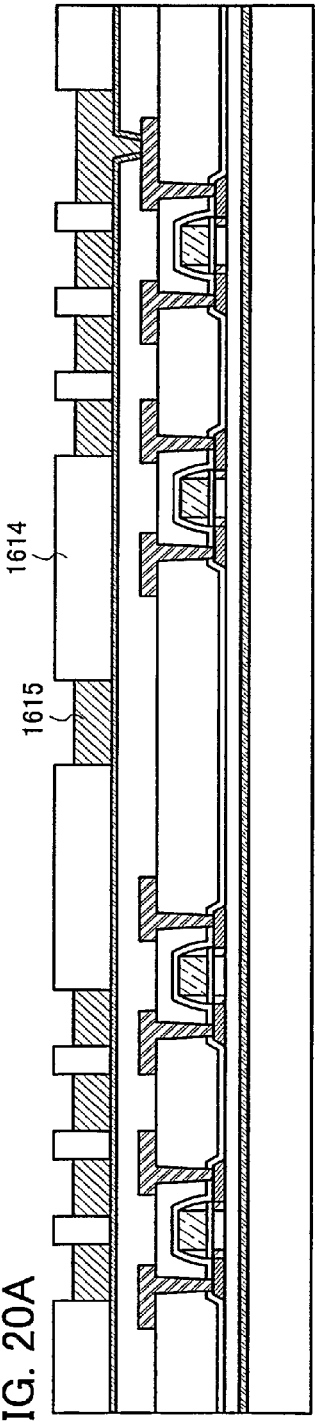
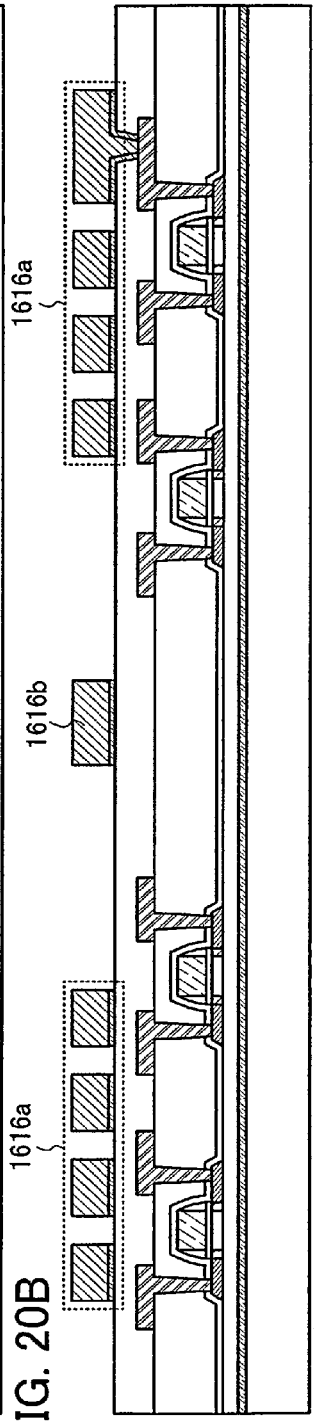
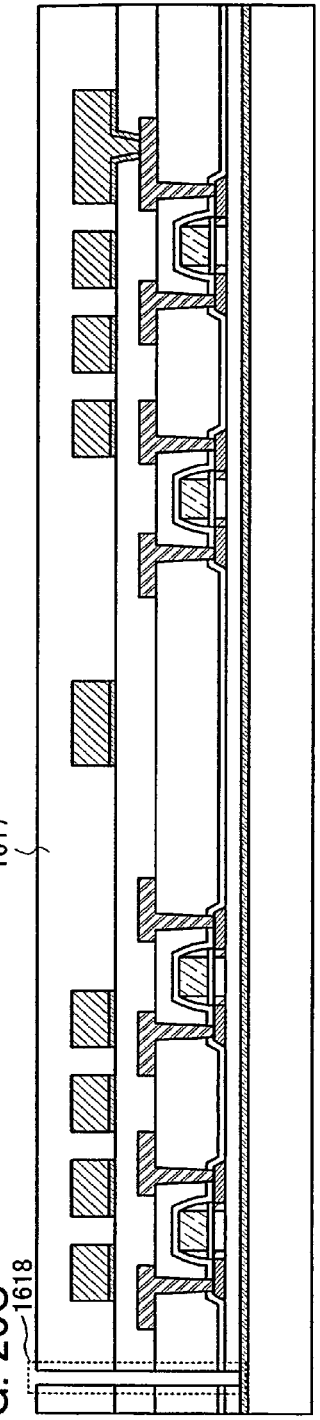

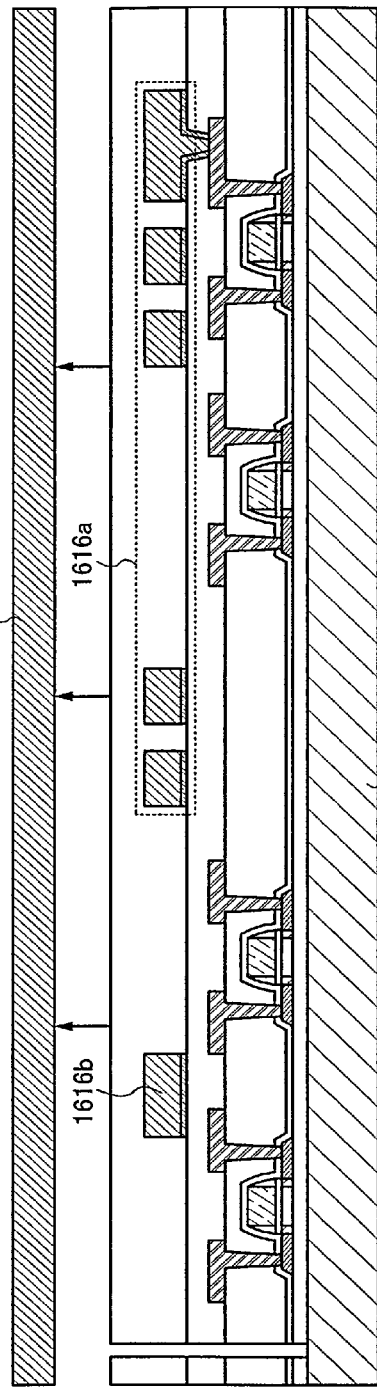
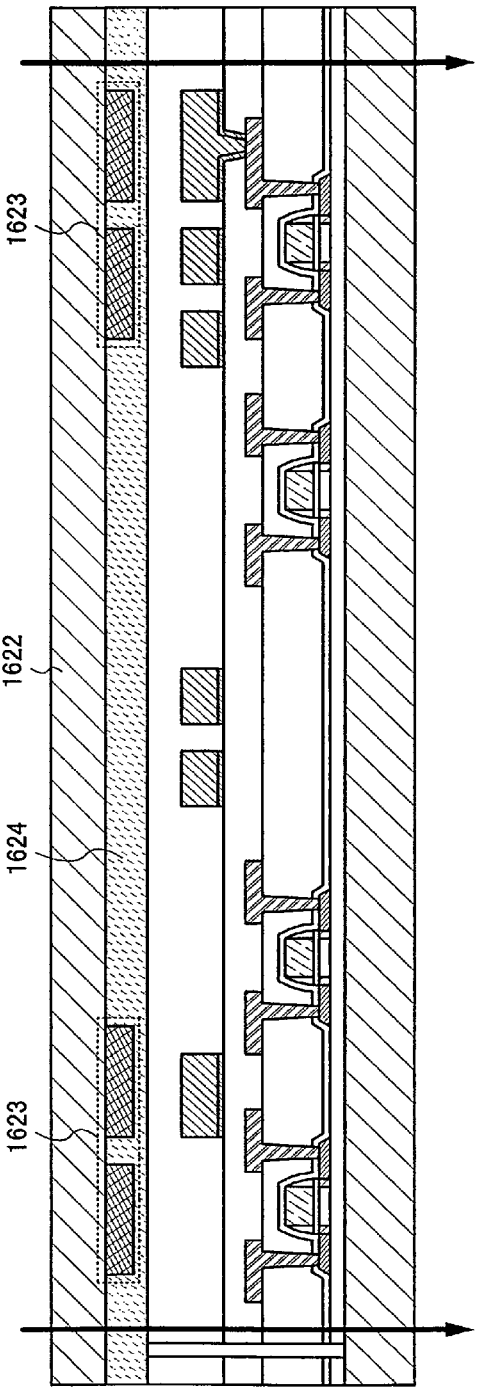
FIG. 23A
FIG. 23B

SEMICONDUCTOR DEVICE

BACKGROUND OF THE INVENTION

1. Field of the Invention

The present invention relates to a semiconductor device. In particular, the present invention relates to a semiconductor device which performs wireless communication using an electromagnetic wave.

2. Description of the Related Art

In recent years, an individual identification technology which utilizes an electromagnetic wave for wireless communication has attracted attention. In particular, an individual identification technology that utilizes a semiconductor device using an RFID (Radio Frequency Identification), which is also referred to as an IC (Integrated Circuit) chip, an RF tag, a wireless tag, or an electronic tag, as a semiconductor device that communicates data by wireless communication has attracted attention. The individual identification technology that utilizes a semiconductor device using an RFID (hereinafter also referred to as a semiconductor device) has started to help production, management, or the like of an individual object and has developed for practical use toward application of personal authentication. The semiconductor device includes an antenna and an integrated circuit portion including a signal processing circuit provided with a memory circuit or the like.

In the semiconductor device, connection terminals at one end and the other end of the antenna need to be connected to the integrated circuit portion regardless of the shape of the antenna. Accordingly, the antenna is provided in accordance with the shape and size of the integrated circuit portion.

A plurality of integrated circuit portions can be obtained by forming minute integrated circuit portions from one substrate. Reference 1 discloses that a plurality of semiconductor chips can be obtained by forming a plurality of semiconductor chips with the size of 0.5 mm or less using a silicon wafer; thus, there are an economic advantage and an advantage of high yield (Reference 1: Japanese Published Patent Application No. 2004-78991). Reference 1 also discloses that bending and concentric load of the semiconductor chip can be improved by forming the semiconductor chip with the size of 0.5 mm or less.

SUMMARY OF THE INVENTION

Further, it is possible for an antenna to be incorporated in an integrated circuit portion (hereinafter referred to as integrated on a chip) along with reduction in size of the integrated circuit portion. However, the size of the antenna is reduced by integrating the antenna on a chip. Thus, a communication range between the semiconductor device and an external communication device (also referred to as a reader/writer, a controller, or an interrogator; and hereinafter referred to as a communication device) is reduced, and it has been difficult for the semiconductor device to surely transmit and receive a signal.

Accordingly, as is disclosed in Reference 1, for the semiconductor device, a minute integrated circuit portion and an antenna which is larger than the integrated circuit portion have been separately formed and connected later. However, connection of a connection terminal of the minute integrated circuit portion and connection terminals at one end and the other end of the antenna in the semiconductor device causes reduction in yield due to bad connection. Further, stress is applied to a connection portion of the integrated circuit portion and the antenna with respect to bending and concentric load of the semiconductor device, which causes disconnection or bad connection.

The present invention is made to solve the foregoing problems and provides a semiconductor device in which an integrated circuit portion and an antenna are easily connected and which can surely transmit and receive a signal to and from a communication device.

In order to solve the foregoing problems, the inventors have conceived an idea which is contrary to the above-described objects to be solved, that is, an idea that the size of the integrated circuit portion is made close to the size of the antenna in order to increase the size of the antenna. In a semiconductor device of the invention, an integrated circuit portion is formed over a substrate using a thin film transistor so that the area occupied by the integrated circuit portion is increased. Further, in the semiconductor device of the invention, an antenna is provided over the integrated circuit portion, and the thin film transistor and the antenna are connected to each other. Thus, the size of the integrated circuit portion can be close to the desired size of the antenna, so that the integrated circuit portion and the antenna are easily connected and the semiconductor device can surely transmit and receive a signal to and from a communication device.

Note that in the invention, a thin film transistor that includes a non-single crystalline semiconductor film typified by an amorphous silicon film or a polycrystalline silicon film can be employed as the above-described thin film transistor. Such a transistor can be formed at low manufacturing temperature, can be formed at low cost, can be formed over a large substrate or a light-transmitting substrate, and can transmit light. Further, a thin film transistor obtained by thinning a compound semiconductor such as ZnO, a-InGaZnO, SiGe, or GaAs can be employed. Such a transistor can be formed at low temperature or at room temperature, and can be formed directly on a low heat-resistant substrate such as a plastic substrate or a film substrate. Alternatively, a transistor formed by an inkjet method or a printing method, or the like may be employed. Such a transistor can be formed at room temperature, can be formed in a low vacuum, and can be formed using a large substrate. Further, since such a transistor can be formed without using a mask (a reticle), layout of the transistor can be easily changed.

Note that a semiconductor device refers to a device having a circuit including a semiconductor element (such as a transistor). Further, a semiconductor device may refer to any device which can function by utilizing semiconductor characteristics. Alternatively, a semiconductor device refers to a device including a semiconductor material.

Note that when it is explicitly described that B is formed on or over A, it does not necessarily mean that B is formed on and in direct contact with A. The description includes the case where A and B are not in direct contact with each other, that is, the case where another object is interposed between A and B. Here, each of A and B refers to an object (e.g., a device, an element, a circuit, a wiring, an electrode, a terminal, a conductive film, or a layer).

According to the invention, in the semiconductor device, the size of the integrated circuit portion can be close to the desired size of the antenna, and the integrated circuit portion and the antenna are easily connected. Thus, the semiconductor device can surely transmit and receive a signal to and from a communication device. Further, in the invention, by forming the integrated circuit portion using thin film transistors, improvement in productivity and reduction in cost can be realized as compared with the case of mass production of a semiconductor device using a silicon wafer.

BRIEF DESCRIPTION OF THE DRAWINGS

FIGS. 9A and 9B illustrate a semiconductor device in Embodiment Mode 2.

FIGS. 18A to 18D illustrate a semiconductor device in Embodiment Mode 4.

FIGS. 19A to 19C illustrate a semiconductor device in Embodiment Mode 4.

FIGS. 20A to 20C illustrate a semiconductor device in Embodiment Mode 4.

FIGS. 23A and 23B illustrate a semiconductor device in Embodiment Mode 5.

DETAILED DESCRIPTION OF THE INVENTION

Figure 1:
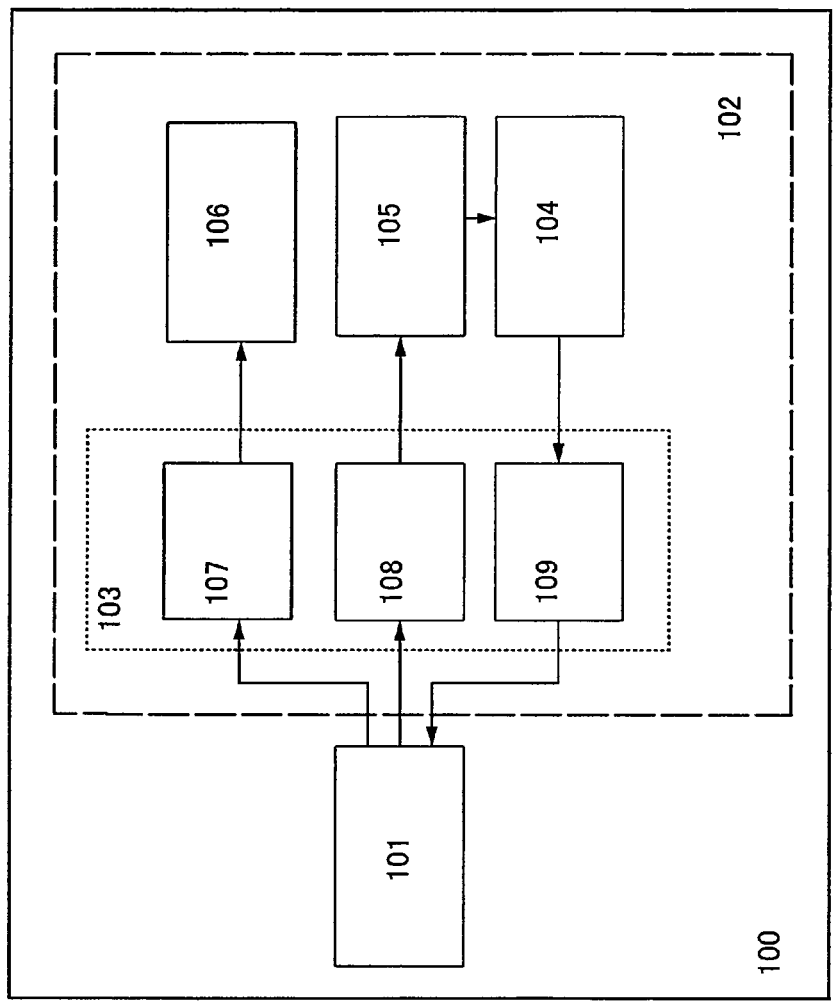
FIG. 1 illustrates a semiconductor device in Embodiment Mode 1.

Hereinafter, embodiment modes of the present invention will be described with reference to drawings. However, the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in the drawings in this specification, the same reference numerals are used for the same portions and portions having similar functions, and description thereof is omitted.

Embodiment Mode 1

A structure of a semiconductor device of the invention is described with reference to FIG. 1.

FIG. 1 shows a structure example of a block diagram of a semiconductor device used in the invention. The semiconductor device shown in FIG. 1 includes an antenna 101 and an integrated circuit portion 102 over a substrate 100. The integrated circuit portion 102 is provided with a transmission/reception circuit 103, a memory circuit 104, a memory control circuit 105, and a power supply circuit 106. The transmission/reception circuit 103 includes a rectification circuit 107, a demodulation circuit 108, and a modulation circuit 109.

The transmission/reception circuit 103 shown in FIG. 1 has a rectification function in which electric power of an electromagnetic wave received by the antenna 101 (hereinafter referred to as a wireless signal) is converted into a power supply potential, a demodulation function in which data is extracted from the wireless signal, and a modulation function in which data is transmitted from the transmission/reception circuit 103. In the transmission/reception circuit 103 shown in FIG. 1, a circuit having the rectification function is the rectification circuit 107. The rectification circuit 107 rectifies and smoothes an alternating current wireless signal received by the antenna, and supplies the signal as a direct current signal to the power supply circuit 106, for example. A circuit having the demodulation function is the demodulation circuit 108. The demodulation circuit 108 converts the alternating current wireless signal received by the antenna into a demodulated signal with a diode or the like, and outputs the signal to the memory control circuit, for example. A circuit having the modulation function is the modulation circuit 109. The modulation circuit 109 performs ASK (amplitude shift keying) modulation by changing the intensity of reflection of a carrier wave from a communication device in accordance with change in input impedance of the semiconductor device based on data read from the memory control circuit, and transmits data to the communication device. Note that the modulation circuit 109 may perform FSK (frequency shift keying) modulation other than ASK modulation and transmit data to the communication device.

The memory circuit 104 shown in FIG. 1 is acceptable as long as it holds data of the integrated circuit portion. For example, a mask ROM, an EPROM, an EEPROM, a flash memory, or a ferroelectric memory which is classified as a nonvolatile memory can be used. Note that when the semiconductor device is provided with a battery so that electric power is constantly supplied to the memory circuit, a DRAM (dynamic random access memory) or an SRAM (static random access memory) which is classified as a volatile memory can be used as well.

The memory control circuit 105 is acceptable as long as it controls reading of data from the memory circuit 104 based on a demodulation signal output from the transmission/reception circuit 103. The memory control circuit 105 controls reading of data from the memory circuit 104 by a combination of a plurality of logic circuits including thin film transistors, for example. Further, the power supply circuit 106 is acceptable as long as it outputs a rectified signal output from the transmission/reception circuit 103 as a constant voltage signal. The power supply circuit 106 makes a signal input thereto constant voltage with a regulator including a thin film transistor, for example.

Figure 2:
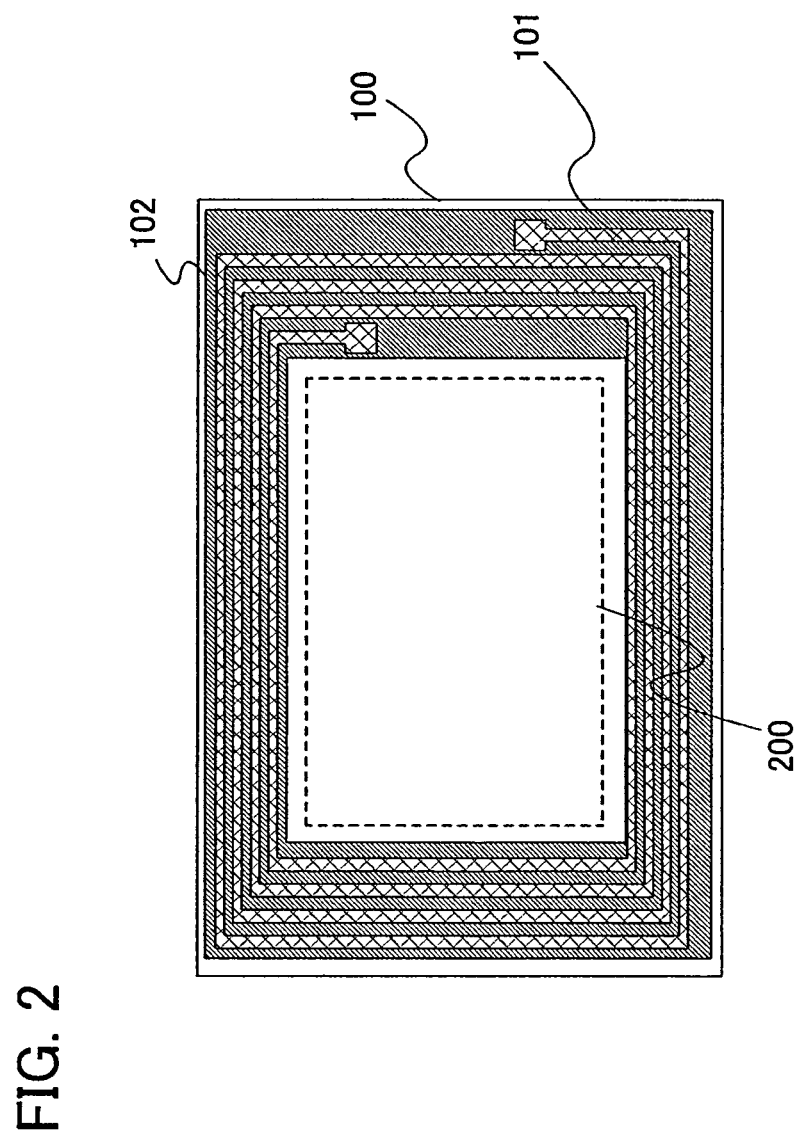
FIG. 2 illustrates a semiconductor device in Embodiment Mode 1.

Next, FIG. 2 is a schematic top plan view of the structure shown in FIG. 1 of the invention.

A semiconductor device of the invention shown in FIG. 2 includes the integrated circuit portion 102 and the antenna 101 over the substrate 100. The integrated circuit portion 102 and a region 200 occupy a surface of the substrate 100. The integrated circuit portion 102 includes a wiring and a semiconductor layer. The region 200 does not include a wiring and a semiconductor layer. The antenna 101 which is arranged circularly occupies a surface of the integrated circuit portion 102. The first feature of the invention is that the area of the surface of the integrated circuit portion 102 and a region inside the integrated circuit portion (in this embodiment mode, the region 200) which is in contact with the substrate 100 is made close to the area of the surface of the substrate 100. That is, the area of the surface of the integrated circuit portion 102 is designed so as to be approximately the same as the area of the surface of the substrate 100; thus, the design rule of a transistor included in the integrated circuit portion can be increased, and memory capacity of the memory circuit can be increased, which contributes to realizing multifunctions of the semiconductor device, for example.

Note that it is preferable that the area of the surface the integrated circuit portion 102 be approximately the same as the area of the surface of the integrated circuit portion 102 and the region 200; however, the relation is not necessarily satisfied depending on the shape of the antenna or an end portion of the substrate. Accordingly, in this specification, the description that the area of the surface of the integrated circuit portion 102 is approximately the same as the area of the surface of the substrate 100 means that an area of the substrate occupied by the integrated circuit portion is at least 0.5 times, preferably at least 0.7 times, and more preferably at least 0.9 times as large as the area of the surface of the substrate 100. Further, the upper limit of the area of the substrate occupied by the integrated circuit portion is equal to or less than the area of the surface of the substrate 100, considering that the integrated circuit portion is formed over the surface of the substrate. That is, according to the invention, the area of the substrate occupied by the integrated circuit portion is 0.5 to 1 times, preferably 0.7 to 1 times, and more preferably 0.9 to 1 times as large as the area of the surface of the substrate 100. Note that the area of the substrate occupied by the integrated circuit portion in this specification includes a region inside the integrated circuit portion, and a region of a depressed portion and the like in an end portion of the integrated circuit portion.

Note that the region 200 is provided in order to easily pass an alternating current magnetic field in communicating with the communication device and obtain electromotive force. Accordingly, by enlargement of the region 200, the semiconductor device is easily influenced by an alternating current magnetic field generated by the antenna even when a distance between the semiconductor device and the communication device is large; thus, the semiconductor device is suitable for long distance communication.

A signal transmission method of a semiconductor device which performs wireless communication depends on the frequency of the signal used for wireless communication. The shape of the antenna varies widely depending on the transmission method. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the antenna, a conductor functioning as an antenna has a circular shape (e.g., a loop shape or a coil shape) as shown in FIG. 2. The second feature of the invention is that the antenna 101 which is the same size as the integrated circuit portion 102 is provided over the integrated circuit portion 102. The invention is effective in that a communication range is increased by increasing the size of the antenna arranged circularly in proportion to the size of the area of the substrate occupied by the integrated circuit portion, and thus, the semiconductor device can surely communicate with the communication device.

Note that for a thin film transistor included in the integrated circuit portion of the semiconductor device of the invention, a thin film transistor including a non-single crystalline semiconductor film typified by amorphous silicon, polycrystalline silicon, microcrystalline (also referred to as semi-amorphous) silicon, or the like can be used. The use of the thin film transistor has various advantages. For example, since a thin film transistor can be formed at a temperature lower than that of a semiconductor device using single crystalline silicon cut from a silicon wafer, reduction in manufacturing cost or increase in size of a manufacturing device can be realized. Since the manufacturing device can be made larger, a transistor can be formed using a large substrate. Accordingly, a large number of semiconductor devices can be formed at the same time, and thus can be formed at low cost. Further, since manufacturing temperature is low, a substrate having low heat resistance can be used. Accordingly, a transistor can be formed over an inexpensive glass substrate. Since the glass substrate is transparent, transmission of light can be controlled by a semiconductor device using a transistor formed over a transparent substrate. Alternatively, since the thickness of a transistor is thin, part of a film forming the transistor can transmit light; thus, the design can be improved.

In addition, a thin film transistor including a compound semiconductor or an oxide semiconductor such as ZnO, a-In-GaZnO, SiGe, GaAs, IZO, ITO, or SnO can be used as well. By using such a semiconductor, manufacturing temperature can be lowered and for example, a thin film transistor can be formed at room temperature. Thus, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used for a resistor. Further, since such an element can be formed or patterned at the same time as the transistor, cost can be reduced.

Alternatively, a thin film transistor formed by an inkjet method or a printing method can be used. Accordingly, a transistor can be formed at room temperature or in a low vacuum, or can be formed over a large substrate. Further, since the thin film transistor can be formed without using a mask (a reticle), layout of the thin film transistor can be easily changed. Furthermore, since it is not necessary to use a resist, material cost is reduced and thus, the number of steps can be reduced. Moreover, since a film is formed only in a required portion, the material is not wasted and cost can be reduced as compared with a manufacturing method in which etching is performed after a film is formed over the entire surface.

Note that various substrates can be used for the semiconductor device of the invention. For a substrate provided with a thin film transistor, a single crystalline substrate, an SOI substrate, a glass substrate, a quartz substrate, a plastic substrate, or the like can be used.

When an antenna for the semiconductor device of the invention is formed over the same substrate as the integrated circuit portion, a conductive film may be formed by a sputtering method, a CVD method, a spin coating method, or the like and patterned to form the antenna. Alternatively, the antenna may be formed by a droplet discharging method typified by an inkjet method, a screen printing method, or an additive method or a semi-additive method, or the like.

Note that a plurality of integrated circuit portions and antennas are formed over a substrate and the substrate is cut into a plurality of sections, so that the semiconductor device can be mass-produced. According to the invention, a thin film transistor can be formed over a substrate which is less expensive than a silicon wafer and the semiconductor device can be mass-produced, which is an economic advantage.

Figure 3:
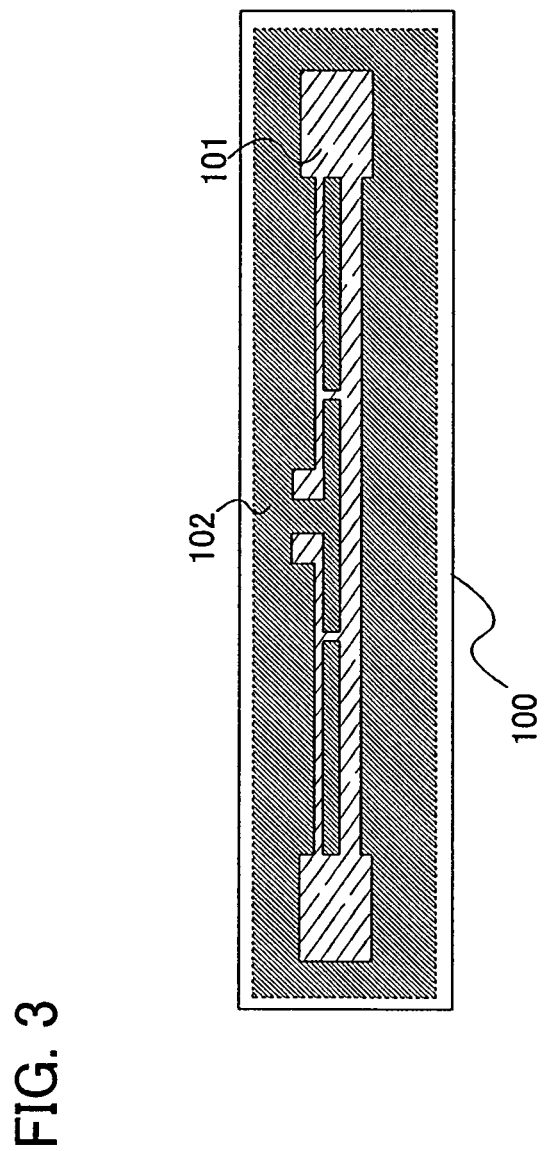
FIG. 3 illustrates a semiconductor device in Embodiment Mode 1.

Note that FIG. 2 shows an example in which an electromagnetic coupling method or an electromagnetic induction method is employed for the signal transmission method of the semiconductor device which performs wireless communication and a circular antenna is used; however, the invention is not limited thereto. For example, when the frequency of the signal is in the UHF band (a band of 860 to 930 MHz) or the 2.45 GHz band, a microwave method (also referred to as an electromagnetic wave method) may be employed for the signal transmission method of the semiconductor device which performs wireless communication. FIG. 3 shows an example of a semiconductor device of the invention using an antenna with a shape capable of wireless communication by an electromagnetic wave method. The shape of the antenna shown in FIG. 3 can be a thin rod shape.

The semiconductor device of the invention shown in FIG. 3 includes the integrated circuit portion 102 and the antenna 101 over the substrate 100. The integrated circuit portion 102 is formed over a surface of the substrate 100. The thin rod-shaped antenna 101 is formed over the integrated circuit portion 102. In the semiconductor device of the invention shown in FIG. 3, similarly to the case of FIG. 2, the size of the integrated circuit portion is made close to the desired size of the antenna so that the integrated circuit portion and the antenna are easily connected; thus, the semiconductor device can surely transmit and receive a signal to and from the communication device. That is, by provision of the integrated circuit portion which is approximately the same size as the substrate, the semiconductor device in which the integrated circuit portion can be easily connected to the antenna can be obtained. At the same time, the antenna which is approximately the same size as the substrate can be formed over the integrated circuit portion which is approximately the same size as the substrate, so that a large antenna can be formed, unlike the case where an antenna is formed over an integrated circuit portion formed using a silicon wafer. Thus, the semiconductor device can surely transmit and receive a signal to and from the communication device.

Figure 4:
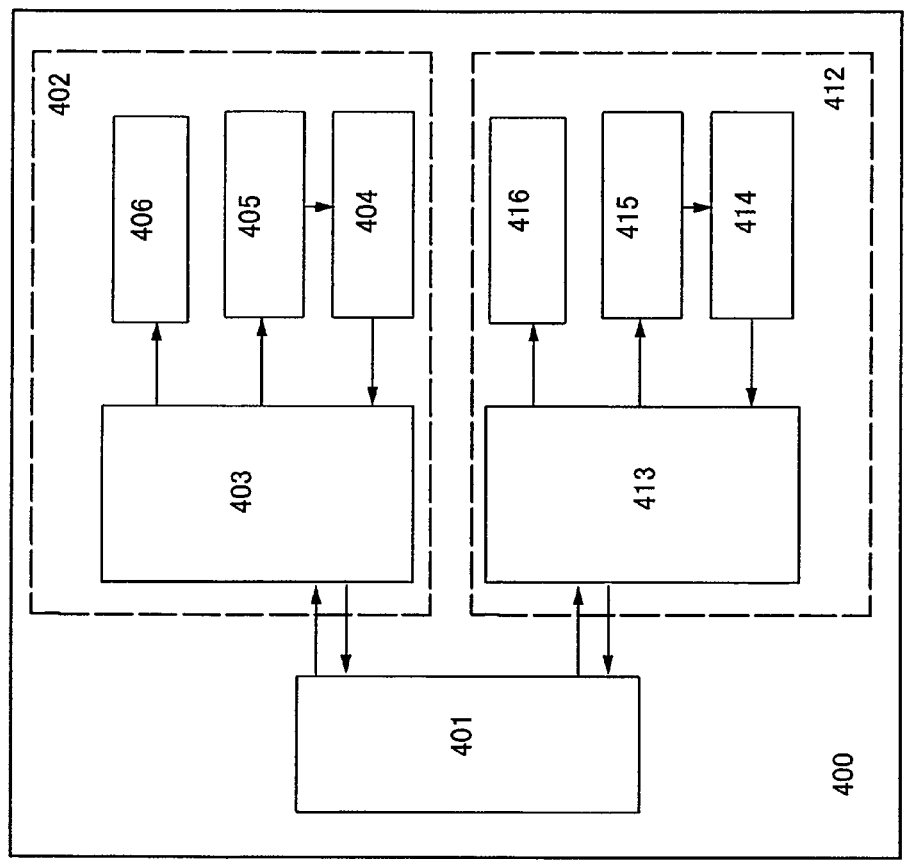
FIG. 4 illustrates a semiconductor device in Embodiment Mode 1.

A structure of the semiconductor device of the invention is not limited to the structure shown in FIG. 1. FIG. 4 shows a structure of a block diagram which is different from the block diagram of the semiconductor device of the invention shown in FIG. 1. FIG. 4 illustrates a structure in which a semiconductor device of the invention includes a plurality of integrated circuit portions.

FIG. 4 shows a structure example of a block diagram of the semiconductor device used in the invention. The semiconductor device shown in FIG. 4 includes an antenna 401, a first integrated circuit portion 402, and a second integrated circuit portion 412 over a substrate 400. The first integrated circuit portion 402 is provided with a transmission/reception circuit 403, a memory circuit 404, a memory control circuit 405, and a power supply circuit 406. The second integrated circuit portion 412 is provided with a transmission/reception circuit 413, a memory circuit 414, a memory control circuit 415, and a power supply circuit 416. The transmission/reception circuits 403 and 413 each include a rectification circuit, a demodulation circuit, and a modulation circuit (which are not shown).

Structures and functions of the transmission/reception circuits 403 and 413 shown in FIG. 4 are similar to those of the transmission/reception circuit 103 shown in FIG. 1. That is, the transmission/reception circuits 403 and 413 each transmit and receive a wireless signal by a rectification circuit having a rectification function, a demodulation circuit having a demodulation function, and a modulation circuit having a modulation function. Further, the description of the memory circuit 104, the memory control circuit 105, and the power supply circuit 106 shown in FIG. 1 is applicable to the memory circuits 404 and 414, the memory control circuits 405 and 415, and the power supply circuits 406 and 416 shown in FIG. 4.

The structure of the semiconductor device shown in FIG. 4 is different from the structure of the semiconductor device shown in FIG. 1 in that a plurality of integrated circuit portions are included. Accordingly, different programs can be stored in the memory circuits of the integrated circuits. Thus, the semiconductor device shown in FIG. 4 can be used for a plurality of applications at the same time. Further, when the same identification information is stored in a plurality of memory circuits of the integrated circuit portions, the semiconductor device shown in FIG. 4 can have redundancy against malfunction and breakdown of the integrated circuit portions, and thus can have higher durability. Note that the semiconductor device shown in FIG. 4 is not limited to have the structure in which the first integrated circuit portion 402 and the second integrated circuit portion 412 are provided for one antenna 401, and the semiconductor device of the invention may include three or more integrated circuit portions.

Figure 5:
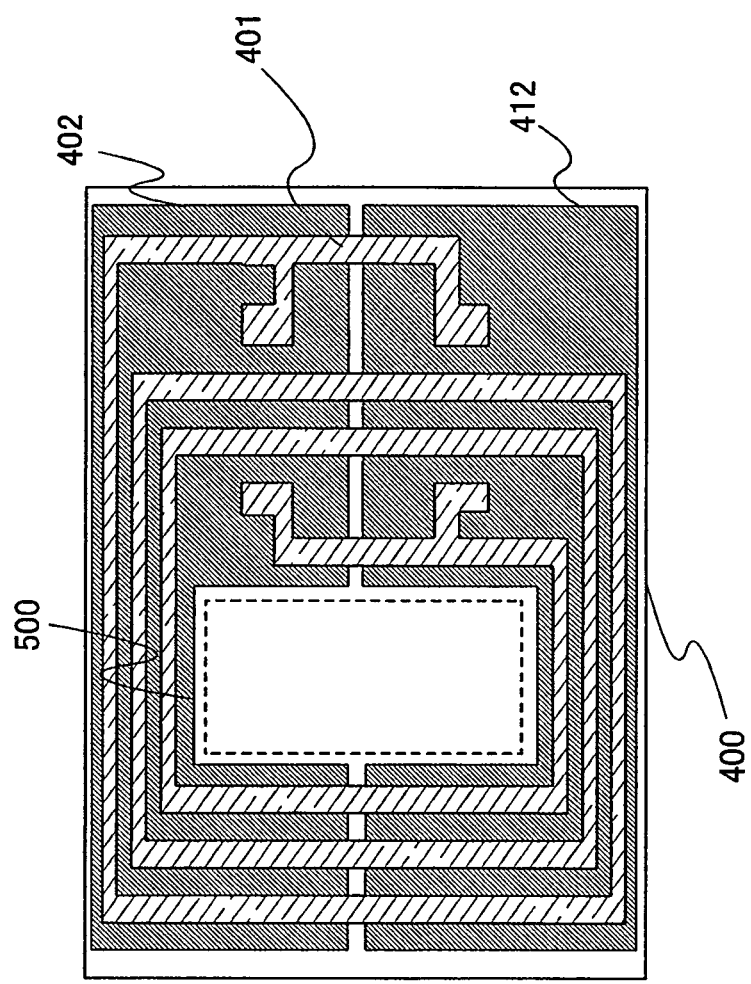
FIG. 5 illustrates a semiconductor device in Embodiment Mode 1.

Next, FIG. 5 is a schematic top plan view of the structure shown in FIG. 4 of the invention.

A semiconductor device of the invention shown in FIG. 5 includes the first integrated circuit portion 402, the second integrated circuit portion 412, and the antenna 401 over the substrate 400. The first integrated circuit portion 402, the second integrated circuit portion 412, and a region 500 occupy a surface of the substrate 400. The antenna 401 which is arranged circularly occupies a surface of the first integrated circuit portion 402 and a surface of the first integrated circuit portion 412. As described in FIG. 2, the first feature of the invention is that the area of the surface of the first integrated circuit portion 402, the surface of the second integrated circuit portion 412, and the region 500 is made close to the area of the surface of the substrate 400. That is, the area of the surfaces of the first integrated circuit portion 402 and the second integrated circuit portion 412 is made to be approximately the same as the area of the surface of the substrate 400; thus, the design rule of a transistor included in the first and second integrated circuit portions can be increased, and memory capacity of the memory circuit can be increased, which contributes to realizing multifunctions of the semiconductor device, for example.

Note that similarly to the case of FIG. 2, it is preferable that the area of the surface of the substrate 400 be approximately the same as the area of the surfaces of the first integrated circuit portion 402 and the second integrated circuit portion 412, and the region 500; however, the relation is not necessarily satisfied depending on the shape of the antenna or an end portion of the substrate. Accordingly, in this specification, the description that the area of the surface of the substrate 400 is approximately the same as the area of the surfaces of the first integrated circuit portion 402 and the second integrated circuit portion 412 means that the area of the substrate occupied by the first integrated circuit portion 402 and the second integrated circuit portion 412 is at least 0.5 times, preferably at least 0.7 times, and more preferably at least 0.9 times as large as the area of the surface of the substrate 400. Further, the upper limit of the area of the substrate occupied by the first integrated circuit portion 402 and the second integrated circuit portion 412 is equal to or less than the area of the surface of the substrate 400, considering that the first integrated circuit portion 402 and the second integrated circuit portion 412 are formed over the surface of the substrate. That is, according to the invention, the area of the substrate occupied by the integrated circuit portions is 0.5 to 1 times, preferably 0.7 to 1 times, and more preferably 0.9 to 1 times as large as the area of the surface of the substrate 400. Note that the area of the substrate occupied by the first integrated circuit portion 402 and the second integrated circuit portion 412 in this specification includes a region inside the integrated circuit portions, and a region of a depressed portion and the like in an end portion of each integrated circuit portion.

Note that the region 500 is provided in order to easily pass an alternating current magnetic field in communicating with the communication device and obtain electromotive force. Accordingly, by enlargement of the region 500, the semiconductor device is easily influenced by an alternating current magnetic field generated by the antenna even when a distance between the semiconductor device and the communication device is large; thus, the semiconductor device is suitable for long distance communication.

A signal transmission method of the semiconductor device which performs wireless communication depends on the frequency of the signal used for wireless communication. The shape of the antenna varies widely depending on the transmission method. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the antenna, a conductor functioning as an antenna has a circular shape (e.g., a loop shape or a coil shape) as shown in FIG. 5. The second feature of the invention is that the antenna 401 which is the same size as the first integrated circuit portion 402 and the second integrated circuit portion 412 is provided over the integrated circuit portions. The invention is effective in that a communication range is increased by increasing the size of the antenna arranged circularly, and thus, the semiconductor device can surely communicate with the communication device. In the structure of the invention shown in FIG. 5, the first integrated circuit portion and the second integrated circuit portion are separately provided over the substrate; however, it is acceptable as long as the functions that the integrated circuits have are separately provided. The invention includes a structure in which a part of the functions is shared. Further, in the structure of FIG. 5, an antenna with a thin rod shape, which performs wireless communication by an electromagnetic wave method, may be used as shown in FIG. 3. The shape of the antenna may be designed as appropriate depending on the transmission method.

Figure 6:
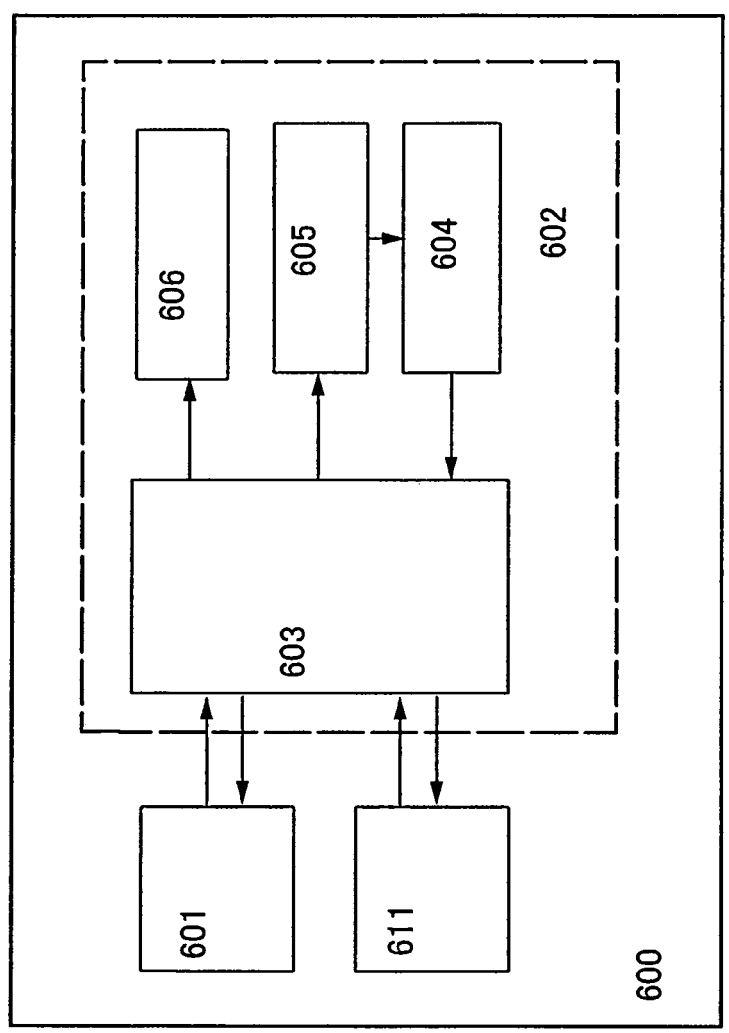
FIG. 6 illustrates a semiconductor device in Embodiment Mode 1.

A structure of the semiconductor device of the invention is not limited to the structures shown in FIGS. 1 and 4. FIG. 6 shows a structure of a block diagram which is different from the block diagrams of the semiconductor device of the invention shown in FIGS. 1 and 4. FIG. 6 illustrates a structure in which a semiconductor device of the invention includes a plurality of antennas.

FIG. 6 shows a structure example of a block diagram of the semiconductor device used in the invention. The semiconductor device shown in FIG. 6 includes a first antenna 601, a second antenna 611, and an integrated circuit portion 602 over a substrate 600. The integrated circuit portion 602 is provided with a transmission/reception circuit 603, a memory circuit 604, a memory control circuit 605, and a power supply circuit 606. The transmission/reception circuit 603 includes a rectification circuit, a demodulation circuit, and a modulation circuit (which are not shown).

A structure and a function of the transmission/reception circuit 603 shown in FIG. 6 are similar to those of the transmission/reception circuit 103 shown in FIG. 1. That is, the transmission/reception circuit 603 transmits and receives a wireless signal by a rectification circuit having a rectification function, a demodulation circuit having a demodulation function, and a modulation circuit having a modulation function. Further, the description of the memory circuit 104, the memory control circuit 105, and the power supply circuit 106 shown in FIG. 1 is applicable to the memory circuit 604, the memory control circuit 605, and the power supply circuit 606 shown in FIG. 6.

The structure of the semiconductor device shown in FIG. 6 is different from the structure of the semiconductor device shown in FIG. 1 in that a plurality of antennas are included. Accordingly, different frequencies or different transmission methods of signals to be transmitted and received can be employed for the first antenna 601 and the second antenna 611. Thus, the semiconductor device shown in FIG. 6 can be used for wireless signals of a plurality of frequencies or wireless signals used by a plurality of transmission methods. Note that the semiconductor device shown in FIG. 6 is not limited to have the structure in which the first antenna 601 and the second antenna 611 are provided for one integrated circuit portion 602, and the semiconductor device of the invention may include three or more antennas.

Figure 7:
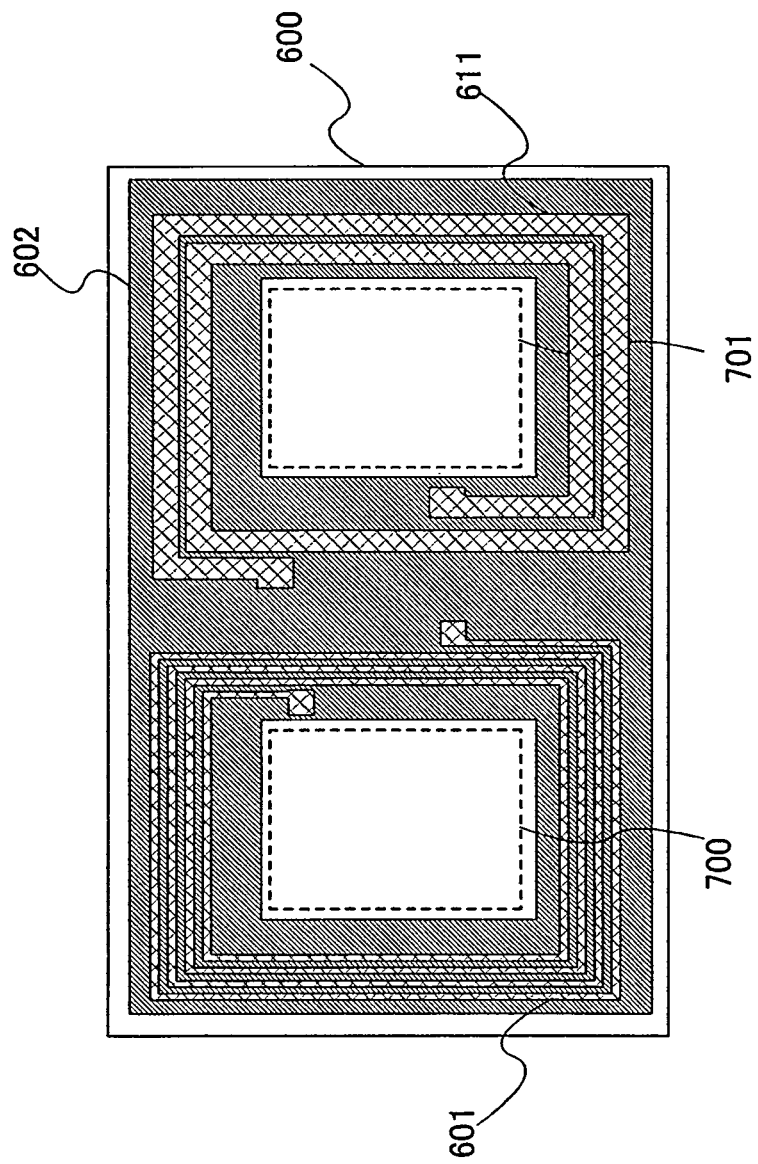
FIG. 7 illustrates a semiconductor device in Embodiment Mode 1.

Next, FIG. 7 is a schematic top plan view of the structure shown in FIG. 6 of the invention.

A semiconductor device of the invention shown in FIG. 7 includes the integrated circuit portion 602, the first antenna 601, and the second antenna 611 over the substrate 600. The integrated circuit portion 602, a region 700, and a region 701 occupy the surface of the substrate 600. The first antenna 601 and the second antenna 611 which are arranged circularly occupy the surface of the integrated circuit portion 602. As described in FIG. 2, the first feature of the invention is that the area of the surface of the integrated circuit portion 602 and the regions 700 and 701 is made close to the area of the surface of the substrate 600. That is, the area of the surface of the integrated circuit portion 602 is made to be approximately the same as the area of the surface of the substrate 600; thus, the design rule of a transistor included in the integrated circuit portion can be increased, and memory capacity of the memory circuit can be increased, which contributes to realizing multifunctions of the semiconductor device, for example.

Note that similarly to the case of FIG. 2, it is preferable that the area of the surface of the substrate 600 be approximately the same as the area of the surface of the integrated circuit portion 602 and the regions 700 and 701; however, the relation is not necessarily satisfied depending on the shape of the antenna or an end portion of the substrate. Accordingly, in this specification, the description that the area of the surface of the integrated circuit portion 602 is provided is approximately the same as the area of the surface of substrate 600 means that the area of the substrate occupied by the integrated circuit portion is at least 0.5 times, preferably at least 0.7 times, and more preferably at least 0.9 times as large as the area of the surface of the substrate 600 is provided. Further, the upper limit of the area of the substrate occupied by the integrated circuit portion is equal to or less than the area of the surface of the substrate 600, considering that the integrated circuit portion is formed over the substrate. That is, according to the invention, the area of the substrate occupied by the integrated circuit portion is 0.5 to 1 times, preferably 0.7 to 1 times, and more preferably 0.9 to 1 times as large as the area of the surface of the substrate 600. Note that the area of the substrate occupied by the integrated circuit portion in this specification includes a region inside the integrated circuit portion, and a region of a depressed portion and the like in an end portion of the integrated circuit portion.

Note that the regions 700 and 701 are provided in order to easily pass an alternating current magnetic field in communicating with the communication device and obtain electromotive force. Accordingly, by enlargement of the regions 700 and 701, the semiconductor device is easily influenced by an alternating current magnetic field generated by the antenna even when a distance between the semiconductor device and the communication device is large; thus, the semiconductor device is suitable for long distance communication.

A signal transmission method of the semiconductor device which performs wireless communication depends on the frequency of the signal used for wireless communication. The shape of the antenna varies widely depending on the transmission method. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the antenna, a conductor functioning as an antenna has a circular shape (e.g., a loop shape or a coil shape) as shown in FIG. 7. The second feature of the invention is that the first antenna 601 and the second antenna 612 each of which is the same size as the integrated circuit portion 602 are provided over the integrated circuit portion 602. A communication range is increased by increasing the size of each antenna arranged circularly; thus, the semiconductor device can surely communicate with the communication device. In the structure shown in FIG. 7, an antenna with a thin rod shape, which performs wireless communication by an electromagnetic wave method, can be used for each of the first antenna and the second antenna, as shown in FIG. 3. The shape of the antenna may be designed as appropriate depending on the transmission method.

As shown in the plurality of structures described above, by the first and second features of the invention, the size of the integrated circuit portion is made close to the desired size of the antenna so that the integrated circuit portion and the antenna are easily connected; thus, the semiconductor device can surely transmit and receive a signal to and from the communication device. That is, by provision of the integrated circuit portion which is approximately the same size as the substrate, the semiconductor device in which the integrated circuit portion can be easily connected to the antenna can be obtained. At the same time, the antenna which is approximately the same size as the substrate can be formed over the integrated circuit portion which is approximately the same size as the substrate, so that a large antenna can be formed, unlike the case where an antenna is formed over an integrated circuit portion formed using a silicon wafer. Thus, the semiconductor device can surely transmit and receive a signal to and from the communication device.

Embodiment Mode 2

In this embodiment mode, a structure which is different from those of the semiconductor device of the invention described in Embodiment Mode 1 is described.

Figure 8:
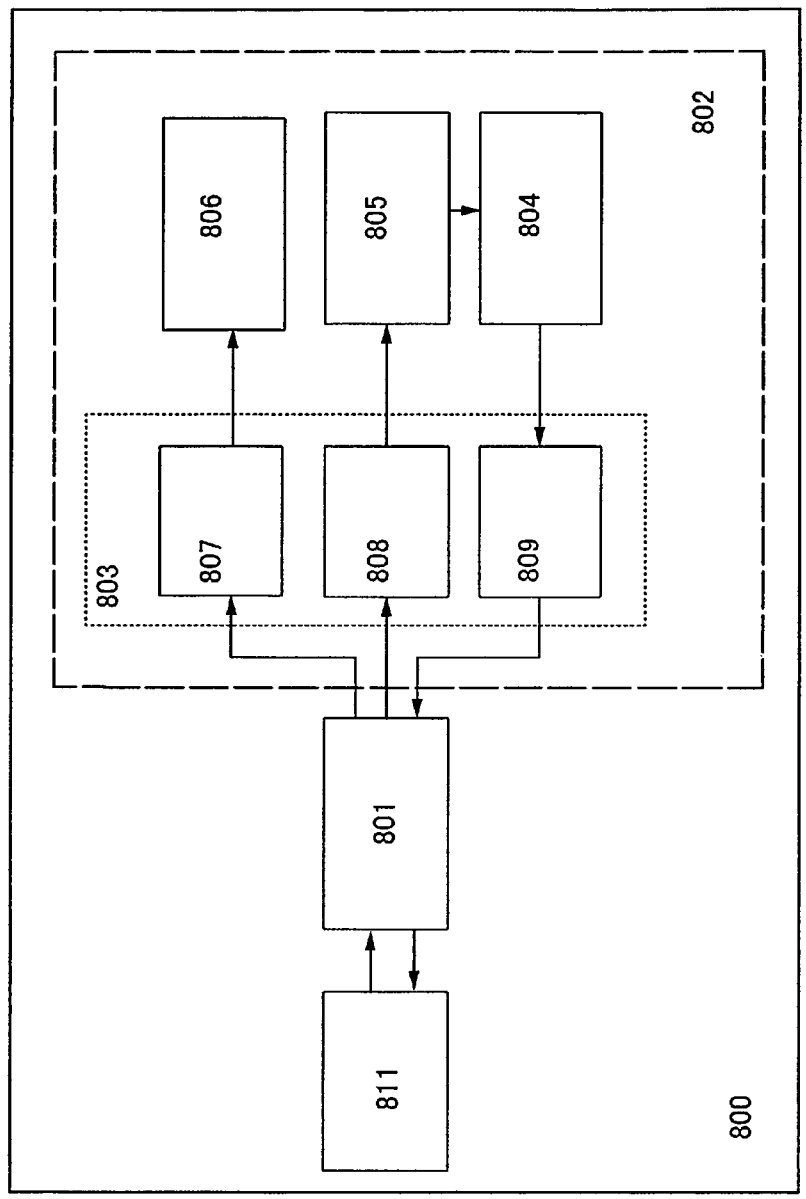
FIG. 8 illustrates a semiconductor device in Embodiment Mode 2.

FIG. 8 shows a structure example of a block diagram of a semiconductor device described in this embodiment mode. The semiconductor device shown in FIG. 8 includes an antenna 801, an integrated circuit portion 802, and a booster antenna 811 over a substrate 800. The integrated circuit portion 802 is provided with a transmission/reception circuit 803, a memory circuit 804, a memory control circuit 805, and a power supply circuit 806. The transmission/reception circuit 803 includes a rectification circuit 807, a demodulation circuit 808, and a modulation circuit 809.

This embodiment mode is different from the structure of FIG. 1 in Embodiment Mode 1 in that the booster antenna is included. In FIG. 8, the booster antenna 811 is included. The booster antenna described in this embodiment mode refers to an antenna which is larger than the antenna 801 that receives a wireless signal from a communication device and outputs the signal to the integrated circuit portion of the semiconductor device. The booster antenna can efficiently transmit a signal output from the communication device to the semiconductor device by being resonated in a frequency band to be used and being magnetic-field coupled to the antenna 801. The booster antenna is coupled to a coil antenna through a magnetic field, which is preferable in that the booster antenna is not needed to be directly connected to the coil antenna.

The transmission/reception circuit 803 shown in FIG. 8 has a rectification function in which electric power of a wireless signal received by the antenna 801 is converted into a power supply potential, a demodulation function in which data is extracted from the wireless signal, and a modulation function in which data is transmitted from the transmission/reception circuit 803. In the transmission/reception circuit 803 shown in FIG. 8, a circuit having the rectification function is the rectification circuit 807. The rectification circuit 807 rectifies and smoothes an alternating current signal received by the antenna, and supplies a direct current signal to the power supply circuit 806, for example. A circuit having the demodulation function is the demodulation circuit 808. The demodulation circuit 808 converts the alternating current signal received by the antenna into a demodulated signal with a diode or the like, and outputs the signal to the memory control circuit, for example. A circuit having the modulation function is the modulation circuit 809. The modulation circuit 809 performs ASK (amplitude shift keying) modulation by changing the intensity of reflection of a carrier wave from the communication device in accordance with change in input impedance of the semiconductor device based on data read from the memory control circuit, and transmits data to the communication device.

The memory circuit 804 shown in FIG. 8 is acceptable as long as it holds data of the integrated circuit portion. For example, a mask ROM, an EPROM, an EEPROM, a flash memory, or a ferroelectric memory which is classified as a nonvolatile memory can be used. Note that when the semiconductor device is provided with a battery so that electric power is constantly supplied to the memory circuit, a DRAM (dynamic random access memory) or an SRAM (static random access memory) which is classified as a volatile memory can be used as well.

The memory control circuit 805 is acceptable as long as it controls reading of data from the memory circuit 804 based on a demodulation signal output from the transmission/reception circuit 803. The memory control circuit 805 controls reading of data from the memory circuit 804 by a combination of a plurality of logic circuits including thin film transistors, for example. Further, the power supply circuit 806 is acceptable as long as it outputs a rectified signal output from the transmission/reception circuit 803 as a constant voltage signal. The power supply circuit 806 makes a signal input thereto constant voltage with a regulator including a thin film transistor, for example.

Next, schematic top plan view and perspective view of the structure shown in FIG. 8 in this embodiment mode are shown in FIGS. 9A and 9B.

The semiconductor device of the invention shown in the top plan view of FIG. 9A includes the integrated circuit portion 802, the antenna 801, and the booster antenna 811 over the substrate 800. The integrated circuit portion 802 and a region 900 occupy a surface of the substrate 800. The antenna 801 and the booster antenna 811 which are arranged circularly occupy a surface of the integrated circuit portion 802. The first feature of the invention is that an area of the surface of the integrated circuit portion 802 and a region inside the integrated circuit portion (in this embodiment mode, the region 900) is made close to an area of the surface of the substrate 800. That is, the area of the surface of the integrated circuit portion 802 is made to be approximately the same as the area of the surface of the substrate 800; thus, the design rule of a transistor included in the integrated circuit portion can be increased, and memory capacity of the memory circuit can be increased, which contributes to realizing multifunctions of the semiconductor device, for example.

Note that it is preferable that the area of the surface of the substrate 800 be approximately the same as the area of the surface of the integrated circuit portion 802 and the region 900; however, the relation is not necessarily satisfied depending on the shape of the antenna or an end portion of the substrate. Accordingly, in this specification, the description that the area of the surface of the substrate 800 is approximately the same as the area of the surface of the integrated circuit portion 802 means that the area of the substrate occupied by the integrated circuit portion is at least 0.5 times, preferably at least 0.7 times, and more preferably at least 0.9 times as large as the area of the surface of the substrate 800. Further, the upper limit of the area of the substrate occupied by the integrated circuit portion is equal to or less than the area of the surface of the substrate 800, considering that the integrated circuit portion is formed over the substrate. That is, according to the invention, the area of the substrate occupied by the integrated circuit portion is 0.5 to 1 times, preferably 0.7 to 1 times, and more preferably 0.9 to 1 times as large as the area of the surface of the substrate 800. Note that the area of the substrate occupied by the integrated circuit portion in this specification includes a region inside the integrated circuit portion, and a region of a depressed portion and the like in an end portion of the integrated circuit portion.

Note that the region 900 is provided in order to easily pass an alternating current magnetic field in communicating with the communication device and obtain electromotive force. Accordingly, by enlargement of the region 900, the semiconductor device is easily influenced by an alternating current magnetic field generated by the antenna even when a distance between the semiconductor device and the communication device is large; thus, the semiconductor device is suitable for long distance communication.

The semiconductor device of the invention shown in the perspective view of FIG. 9B includes the integrated circuit portion 802 and the antenna 801 over the substrate 800, and the booster antenna 811 over a substrate 810. The substrate 810 is the same size as the substrate 800. The booster antenna 811 covers one surface of the substrate 810. Since the booster antenna 811 is not directly connected to the integrated circuit portion 802, the antenna 801 and the booster antenna 811 can be magnetic-field coupled to each other by attaching the substrate 800 to the substrate 810 as shown in FIG. 9B. That is, the substrate 810 overlaps the substrate 800. At this time, the area of the surface of the integrated circuit portion 802 is made close to the area occupied by the booster antenna 811, so that the size of the integrated circuit portion over the substrate 800 can be increased. Further, the design rule of a transistor included in the integrated circuit portion can be increased, and memory capacity of the memory circuit can be increased, which contributes to realizing multifunctions of the semiconductor device, for example. That is, the first feature of the invention that the area of the surface of the substrate 800 and the area of the surface of the integrated circuit portion 802 are approximately the same can be satisfied. Note that the size of the antenna 801 is acceptable as long as the antenna 801 can be provided over the integrated circuit portion. This embodiment mode is effective in that the degree of freedom of the size and arrangement of the antenna which is connected to the integrated circuit portion can be increased.

A signal transmission method of a semiconductor device which performs wireless communication depends on the frequency of the signal used for wireless communication, similarly to Embodiment Mode 1. The shape of the antenna varies widely depending on the transmission method. In this embodiment mode, the shape of the booster antenna 811 which receives a signal from the communication device varies. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the booster antenna 811, a conductor functioning as a booster antenna has a circular shape (e.g., a loop shape or a coil shape) as shown in FIGS. 9A and 9B. In this embodiment mode, the booster antenna 811 can be provided over the integrated circuit portion 802 as an antenna which is the same size as the integrated circuit portion 802, which is the second feature of the invention. A communication range is increased by increasing the size of the booster antenna arranged circularly; thus, the booster antenna can surely communicate with the communication device.

Figure 10A:
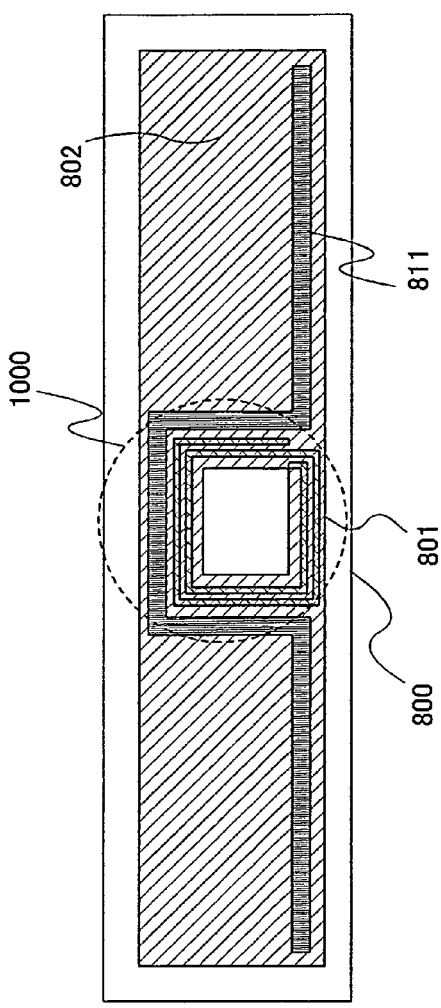
FIGS. 10A and 10B each illustrate a semiconductor device in Embodiment Mode 2.
Figure 10B:
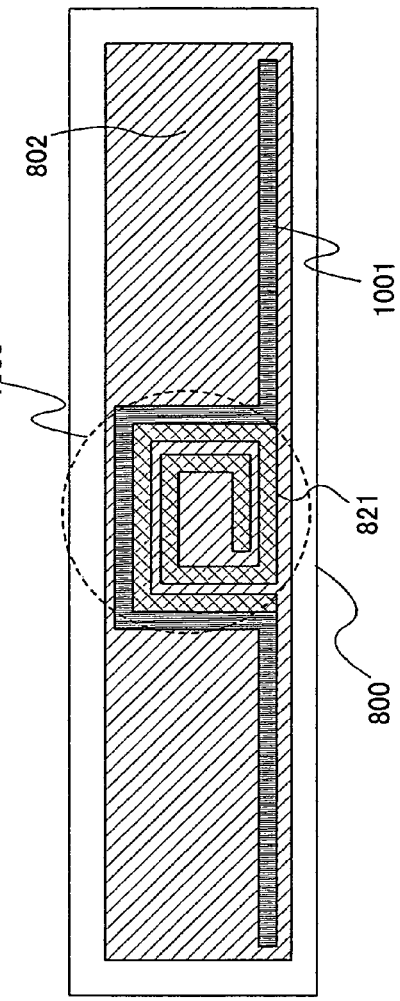

FIGS. 9A and 9B show an example in which an electromagnetic coupling method or an electromagnetic induction method is employed for the signal transmission method of the semiconductor device which performs wireless communication and a circular booster antenna is used; however, the invention is not limited thereto. For example, when the frequency of the signal is in the UHF band (a band of 860 to 930 MHz) or the 2.45 GHz band, a microwave method (also referred to as an electromagnetic wave method) may be employed for the signal transmission method of the semiconductor device which performs wireless communication. FIGS. 10A and 10B show examples of a semiconductor device of the invention using an antenna with a shape capable of wireless communication by an electromagnetic wave method. Each shape of the antennas shown in FIGS. 10A and 10B can be a thin rod shape.

A semiconductor device in this embodiment mode shown in FIG. 10A includes the integrated circuit portion 802, the antenna 801, and the booster antenna 811 over the substrate 800. The integrated circuit portion 802 which is large enough to hold the booster antenna 811 occupies a surface of the substrate 800. The thin rod-shaped booster antenna 811 occupies a surface of the integrated circuit portion 802. In a projection 1000 of the thin rod-shaped booster antenna 811, the coiled antenna 801 is provided and can be magnetic-field coupled to the booster antenna 811. In the structure shown in FIG. 10A, similarly to the case of FIGS. 9A and 9B, the size of the integrated circuit portion is close to the desired size of the antenna, and the degree of freedom of the size of the antenna is increased; thus, the semiconductor device can surely transmit and receive a signal to and from the communication device. That is, by provision of the integrated circuit portion which is approximately the same size as the substrate, the semiconductor device in which the integrated circuit portion can be easily connected to the antenna can be obtained. At the same time, the booster antenna which is approximately the same size as the substrate is provided over the integrated circuit portion which is approximately the same size as the substrate, so that the semiconductor device can surely transmit and receive a signal to and from the communication device.

In this embodiment mode, the booster antenna 811 shown in FIG. 10A may be used as an antenna and the antenna 801 shown in FIG. 10A may be used as a connection terminal. A semiconductor device in this embodiment mode shown in FIG. 10B includes the integrated circuit portion 802, an antenna 1001, and a connection terminal 821 over the substrate 800. The integrated circuit portion 802 which is large enough to hold the antenna 1001 occupies the surface of the substrate 800. The thin rod-shaped antenna 1001 occupies the surface of the integrated circuit portion 802. In the projection 1000 of the thin rod-shaped antenna 1001, the connection terminal 821 is provided, and the integrated circuit portion 802 and the antenna 1001 can be connected. In the structure shown in FIG. 10B, similarly to the description in Embodiment Mode 1, the size of the integrated circuit portion is close to the desired size of the antenna; thus, the semiconductor device can surely transmit and receive a signal to and from the communication device. That is, the semiconductor device in which the integrated circuit portion, which is approximately the same size as the substrate, can be easily connected to the antenna with the connection terminal 821 can be obtained. At the same time, the antenna which is approximately the same size as the substrate is provided over the integrated circuit portion which is approximately the same size as the substrate, so that the semiconductor device can surely transmit and receive a signal to and from the communication device.

Figure 11:
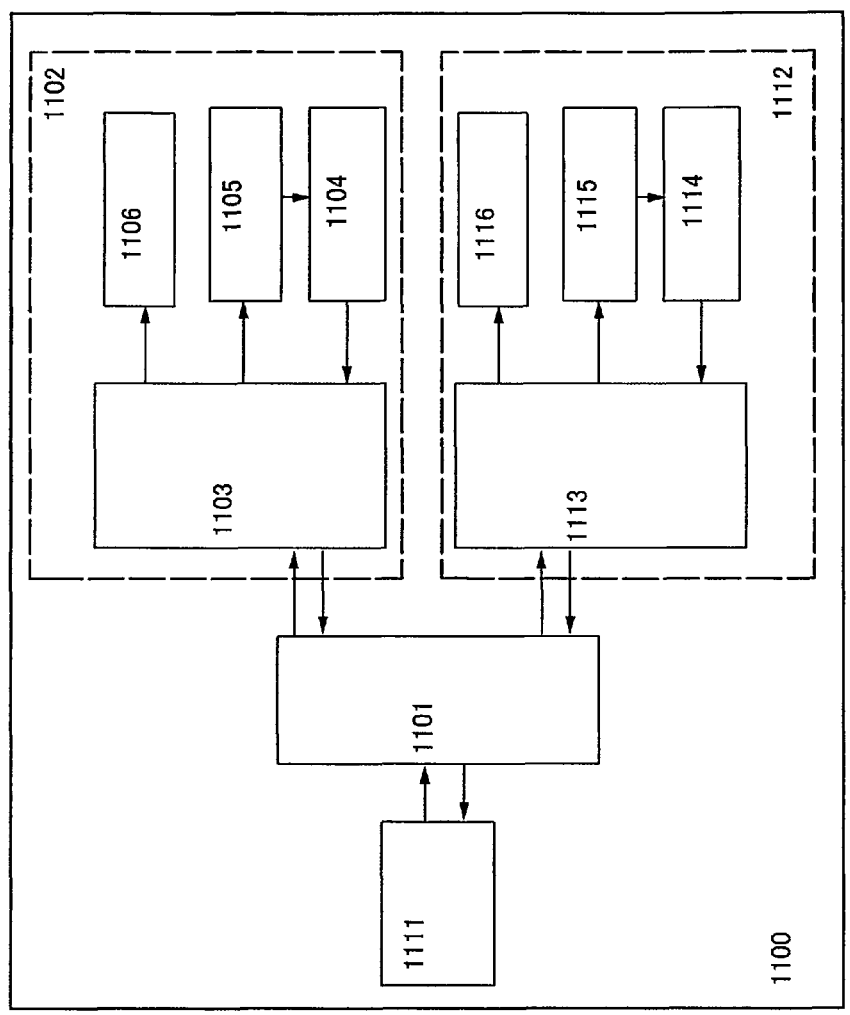
FIG. 11 illustrates a semiconductor device in Embodiment Mode 2.

A structure of the semiconductor device in this embodiment mode is not limited to the structure shown in FIG. 8. FIG. 11 shows a structure of a block diagram which is different from the block diagram of the semiconductor device in this embodiment mode shown in FIG. 8. FIG. 11 illustrates a structure in which a semiconductor device in this embodiment mode includes a plurality of integrated circuit portions.

FIG. 11 shows a structure example of a block diagram of the semiconductor device used in the invention. The semiconductor device shown in FIG. 11 includes an antenna 1101, a first integrated circuit portion 1102, a second integrated circuit portion 1112, and a booster antenna 1111 over a substrate 1100. The first integrated circuit portion 1102 is provided with a transmission/reception circuit 1103, a memory circuit 1104, a memory control circuit 1105, and a power supply circuit 1106. The second integrated circuit portion 1112 is provided with a transmission/reception circuit 1113, a memory circuit 1114, a memory control circuit 1115, and a power supply circuit 1116. The transmission/reception circuits 1103 and 1113 each include a rectification circuit, a demodulation circuit, and a modulation circuit (which are not shown).

Structures and functions of the transmission/reception circuits 1103 and 1113 shown in FIG. 11 are similar to those of the transmission/reception circuit 103 shown in FIG. 1. That is, the transmission/reception circuits 1103 and 1113 each transmit and receive a wireless signal by a rectification circuit having a rectification function, a demodulation circuit having a demodulation function, and a modulation circuit having a modulation function. Further, the description of the memory circuit 104, the memory control circuit 105, and the power supply circuit 106 shown in FIG. 1 is applicable to the memory circuits 1104 and 1114, the memory control circuits 1105 and 1115, and the power supply circuits 1106 and 1116 shown in FIG. 11.

The structure of the semiconductor device shown in FIG. 11 is different from the structure of the semiconductor device shown in FIG. 8 in that a plurality of integrated circuit portions are included. Accordingly, different programs can be stored in the memory circuits of the integrated circuits. Thus, the semiconductor device shown in FIG. 11 can be used for a plurality of applications at the same time. Further, when the same identification information is stored a plurality of in memory circuits of the integrated circuit portions, the semiconductor device shown in FIG. 11 can have redundancy against malfunction and breakdown of the integrated circuit portions, and thus can have higher durability. Note that the semiconductor device shown in FIG. 11 is not limited to have a structure in which the first integrated circuit portion 1102 and the second integrated circuit portion 1112 are provided for one booster antenna 1111 and one antenna 1101, and the semiconductor device of the invention may include three or more integrated circuit portions.

Figure 12:
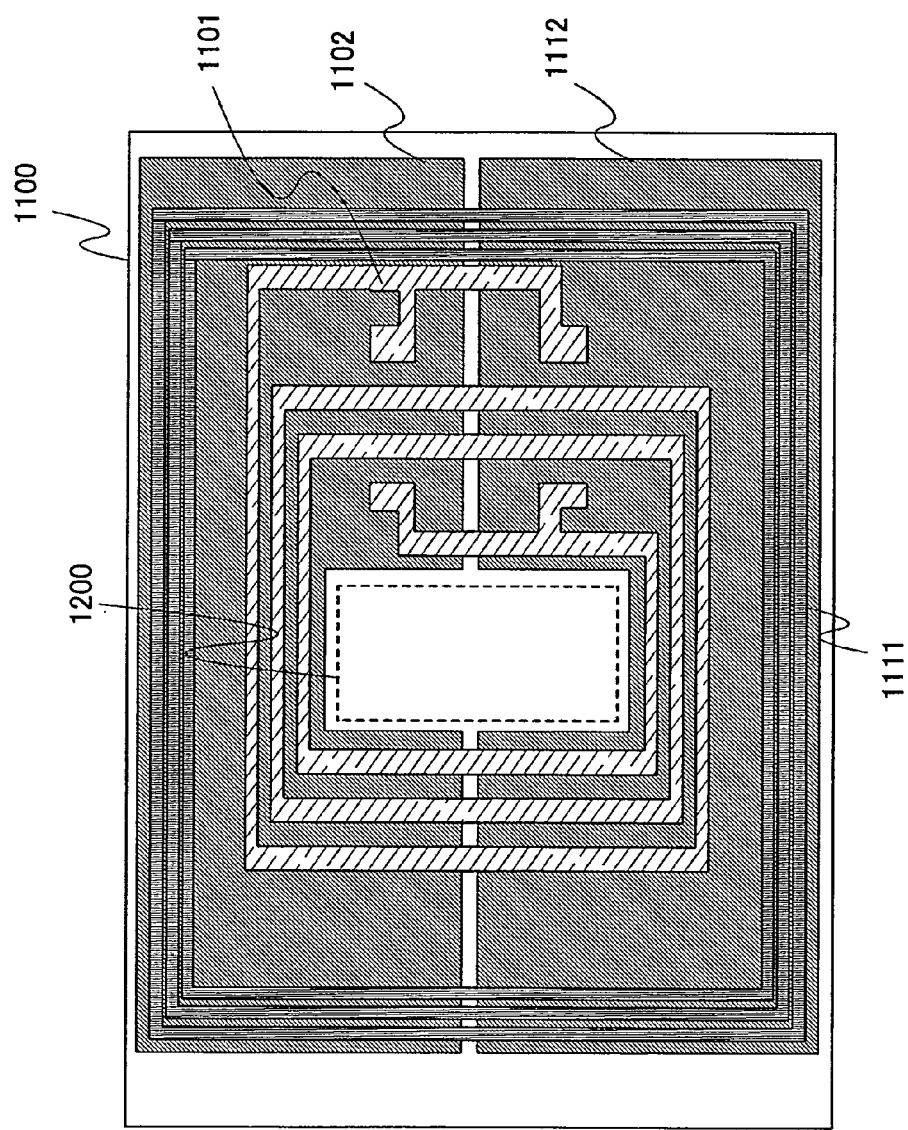
FIG. 12 illustrates a semiconductor device in Embodiment Mode 2.

Next, FIG. 12 is a schematic top plan view of the structure shown in FIG. 11 in this embodiment mode.

A semiconductor device in this embodiment mode shown in FIG. 12 includes the first integrated circuit portion 1102, the second integrated circuit portion 1112, the antenna 1101, and the booster antenna 1111 over the substrate 1100. The first integrated circuit portion 1102, the second integrated circuit portion 1112, and a region 1200 occupy a surface of the substrate 1100. The antenna 1101 and the booster antenna 1111 which are arranged circularly occupy a surface of the first integrated circuit portion 1102 and a surface of the second integrated circuit portion 1112. As described in FIGS. 9A and 9B, the first feature of the invention is that the area of the surface of the first integrated circuit portion 1102, the surface of the second integrated circuit portion 1112, and the region 1200 is made close to the area of a surface of the substrate 1100. That is, the area of surfaces of the first integrated circuit portion 1102 and the second integrated circuit portion 1112 is made to be approximately the same as the area of the surface of the substrate 1100; thus, the design rule of a transistor included in the first and second integrated circuit portions can be increased, and memory capacity of each memory circuit can be increased, which contributes to realizing multifunctions of the semiconductor device, for example. Note that the size of the antenna 1101 is acceptable as long as the antenna 1101 can be provided over the integrated circuit portions. This embodiment mode is effective in that the degree of freedom of the size and arrangement of the antenna which is connected to the integrated circuit portion can be increased.

Note that it is preferable that the area of the surface of the substrate 1100 be approximately the same as the area of the surfaces of the first integrated circuit portion 1102 and the second integrated circuit portion 1112, and the region 1200; however, the relation is not necessarily satisfied depending on the shape of the antenna or an end portion of the substrate. Accordingly, in this specification, the description that the area of the surface of the substrate 1100 is approximately the same as the area of the surfaces of the first integrated circuit portion 1102 and the second integrated circuit portion 1112 means that the area of the substrate occupied by the integrated circuit portions is at least 0.5 times, preferably at least 0.7 times, and more preferably at least 0.9 times as large as the area of the surface of the substrate 1100. Further, the upper limit of the area of the substrate occupied by the integrated circuit portions is equal to or less than the area of the surface of the substrate 1100, considering that the integrated circuit portions are formed over the surface of the substrate. That is, according to the invention, the area of the substrate occupied by the integrated circuit portions is 0.5 to 1 times, preferably 0.7 to 1 times, and more preferably 0.9 to 1 times as large as the area of the surface of the substrate 1100. Note that the area of the substrate occupied by the integrated circuit portions in this specification includes a region inside the integrated circuit portions, and a region of a depressed portion and the like in an end portion of each integrated circuit portion.

Note that the region 1200 is provided in order to easily pass an alternating current magnetic field when the communication device communicates with the booster antenna and when the booster antenna and the antenna are magnetic-field coupled to each other and to obtain electromotive force. Accordingly, by enlargement of the region 1200, the semiconductor device is easily influenced by an alternating current magnetic field generated by the antenna even when a distance between the semiconductor device and the communication device is large; thus, the semiconductor device is suitable for long distance communication.

A signal transmission method of the semiconductor device which performs wireless communication depends on the frequency of the signal used for wireless communication. The shape of the antenna varies widely depending on the transmission method. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the booster antenna, a conductor functioning as a booster antenna has a circular shape (e.g., a loop shape or a coil shape) as shown in FIG. 12. A communication range is increased by increasing the size of the booster antenna arranged circularly; thus, the booster antenna can surely communicate with the communication device. Further, the booster antenna 1111 can be provided over the integrated circuit portion 1102 as an antenna which is the same size as the integrated circuit portion 1102, which is the second feature of the invention. In the structure of this embodiment mode shown in FIG. 12, the first integrated circuit portion and the second integrated circuit portion are separately provided over the substrate; however, it is acceptable as long as the functions that the integrated circuit portions have are separately provided. The invention includes a structure in which a part of the functions is shared. Further, in the structure of FIG. 12, an antenna with a thin rod shape, which performs wireless communication by an electromagnetic wave method, may be used as shown in FIGS. 10A and 10B. The shape of the antenna may be designed as appropriate depending on the transmission method.

Figure 13:
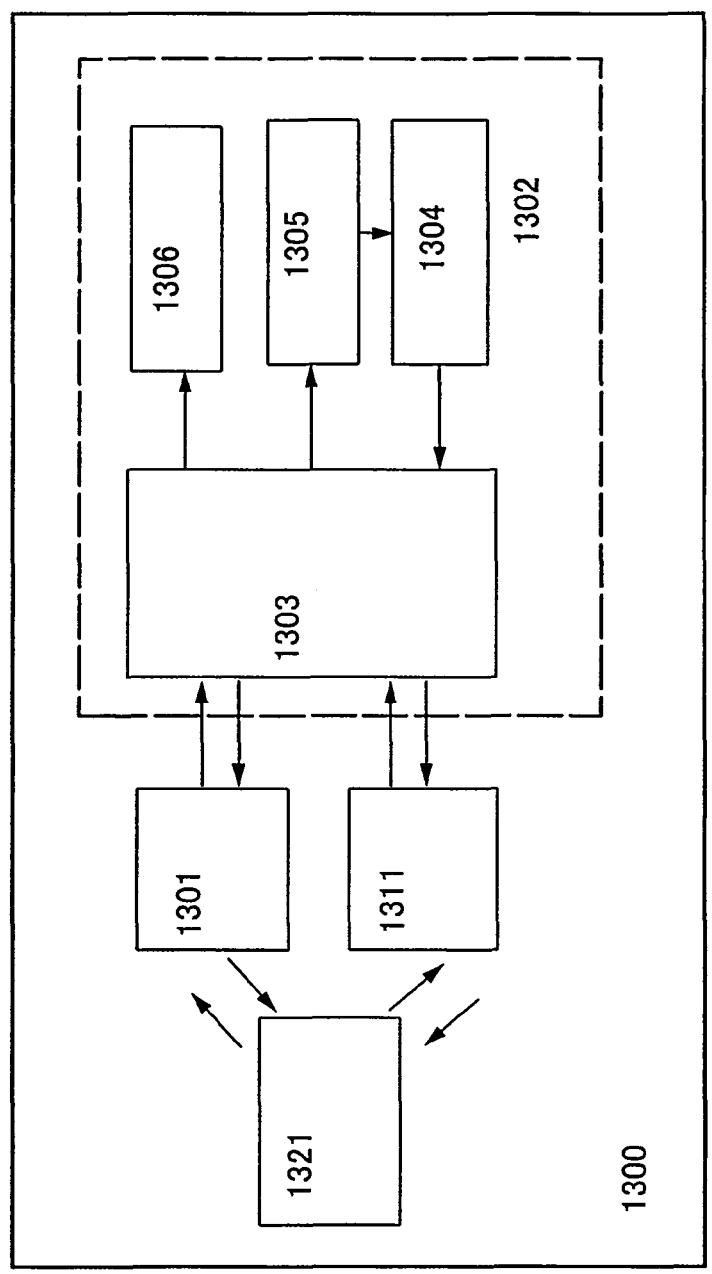
FIG. 13 illustrates a semiconductor device in Embodiment Mode 2.

A structure of the semiconductor device in this embodiment mode is not limited to the structures shown in FIGS. 8 and 11. FIG. 13 shows a structure of a block diagram which is different from the block diagrams of the semiconductor device in this embodiment mode shown in FIGS. 8 and 11.

FIG. 13 illustrates a structure in which a semiconductor device in this embodiment mode includes a plurality of antennas.

FIG. 13 shows a structure example of a block diagram of the semiconductor device used in the invention. The semiconductor device shown in FIG. 13 includes a first antenna 1301, a second antenna 1311, an integrated circuit portion 1302, and a booster antenna 1321 over a substrate 1300. The integrated circuit portion 1302 is provided with a transmission/reception circuit 1303, a memory circuit 1304, a memory control circuit 1305, and a power supply circuit 1306. The transmission/reception circuit 1303 includes a rectification circuit, a demodulation circuit, and a modulation circuit (which are not shown).

A structure and a function of the transmission/reception circuit 1303 shown in FIG. 13 are similar to those of the transmission/reception circuit 803 shown in FIG. 8. That is, the transmission/reception circuit 1303 transmits and receives a wireless signal by a rectification circuit having a rectification function, a demodulation circuit having a demodulation function, and a modulation circuit having a modulation function. Further, the description of the memory circuit 804, the memory control circuit 805, and the power supply circuit 806 shown in FIG. 8 is applicable to the memory circuit 1304, the memory control circuit 1305, and the power supply circuit 1306 shown in FIG. 13.

The structure of the semiconductor device shown in FIG. 13 is different from the structure of the semiconductor device shown in FIG. 8 in that a plurality of antennas are included. Accordingly, different frequencies of signals to be transmitted and received through the booster antenna 1321 can be employed for the first antenna 1301 and the second antenna 1311. Thus, the semiconductor device shown in FIG. 13 can be used for wireless signals of a plurality of frequencies. Note that the semiconductor device shown in FIG. 13 is not limited to have a structure in which the first antenna 1301 and the second antenna 1311 are provided for one integrated circuit portion 1302, and the semiconductor device of the invention may include three or more antennas.

Figure 14:
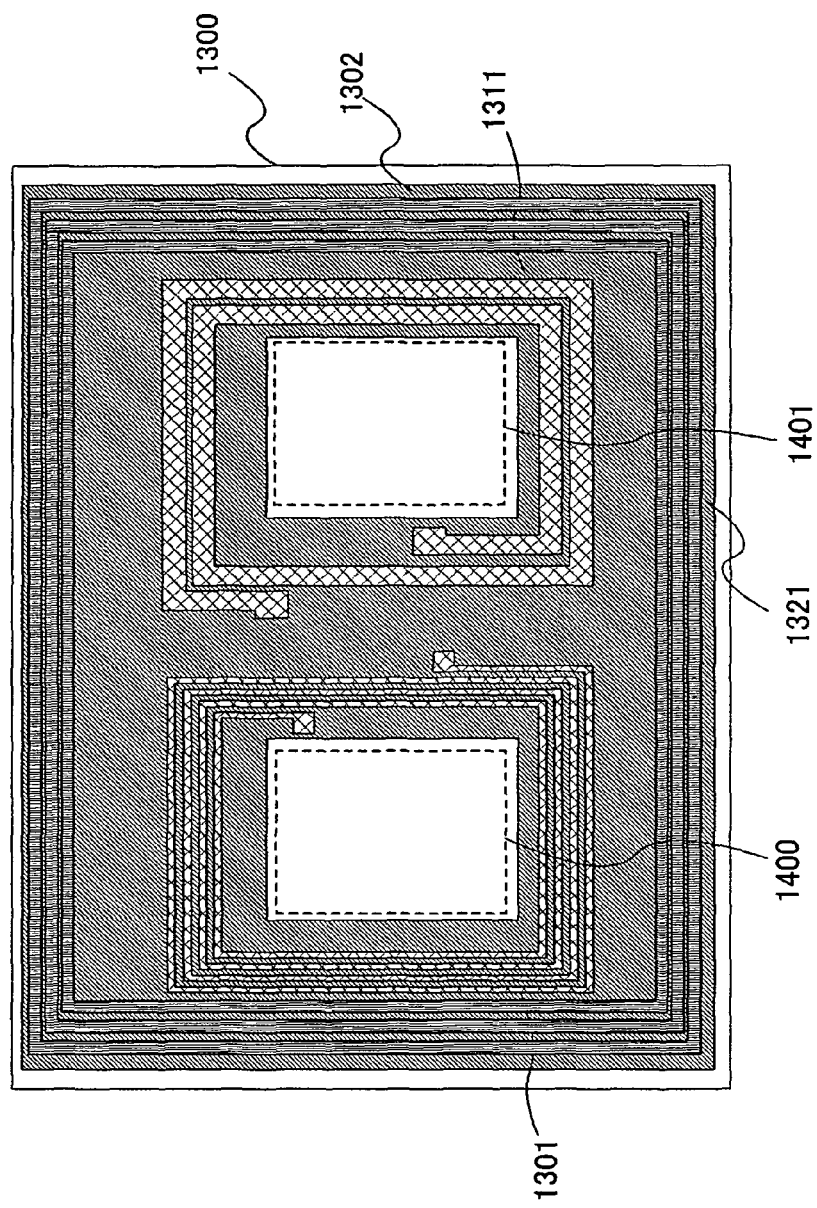
FIG. 14 illustrates a semiconductor device in Embodiment Mode 2.

Next, FIG. 14 is a schematic top plan view of the structure shown in FIG. 13 in this embodiment mode.

A semiconductor device in this embodiment mode shown in FIG. 14 includes the integrated circuit portion 1302, the first antenna 1301, the second antenna 1311, and the booster antenna 1321 over the substrate 1300. The integrated circuit portion 1302, a region 1400, and a region 1401 occupy a surface of the substrate 1300. The first antenna 1301 and the second antenna 1311 which are arranged circularly and the booster antenna 1321 occupy a surface of the integrated circuit portion 1302. As described in FIGS. 9A and 9B, the first feature of the invention is that an area of the surface of the integrated circuit portion 1302 and the regions 1400 and 1401 is made close to an area of the surface of the substrate 1300. That is, the area of the surface of the integrated circuit portion 1302 is made to be approximately the same as the area of the substrate 1300; thus, the design rule of a transistor included in the integrated circuit portion can be increased, and memory capacity of the memory circuit can be increased, which contributes to realizing multifunctions of the semiconductor device, for example. Note that the size of the first antenna 1301 and the second antenna 1311 is acceptable as long as the antennas can be provided over the integrated circuit portion. This embodiment mode is effective in that the degree of freedom of the size and arrangement of the antennas which are connected to the integrated circuit portion can be increased.

Note that it is preferable that the area of the surface of the substrate 1300 be approximately the same as the area of the surface of the integrated circuit portion 1302 and the regions 1400 and 1401; however, the relation is not necessarily satisfied depending on the shape of the antenna or an end portion of the substrate. Accordingly, in this specification, the description that the area of the surface of the substrate 1300 is approximately the same as the area of the surface of the integrated circuit portion 1302 means that the area of the substrate occupied by the integrated circuit portion is at least 0.5 times, preferably at least 0.7 times, and more preferably at least 0.9 times as large as the area of the surface of the substrate 1300. Further, the upper limit of the area of the substrate occupied by the integrated circuit portion is equal to or less than the area of the surface of the substrate 1300, considering that the integrated circuit portion is formed over the substrate. That is, according to the invention, the area of the substrate occupied by the integrated circuit portion is 0.5 to 1 times, preferably 0.7 to 1 times, and more preferably 0.9 to 1 times as large as the area of the surface of the substrate 1300. Note that the area of the substrate occupied by the integrated circuit portion in this specification includes a region inside the integrated circuit portion, and a region of a depressed portion and the like in an end portion of the integrated circuit portion.

Note that the regions 1400 and 1401 shown in FIG. 14 are provided in order to easily pass an alternating current magnetic field when the communication device communicates with the booster antenna and when the booster antenna and the antenna are magnetic-field coupled to each other and to obtain electromotive force. Accordingly, by enlargement of the regions 1400 and 1401, the semiconductor device is easily influenced by an alternating current magnetic field generated by the antenna even when a distance between the semiconductor device and the communication device is large; thus, the semiconductor device is suitable for long distance communication.

A signal transmission method of the semiconductor device which performs wireless communication depends on the frequency of the signal used for wireless communication, similarly to Embodiment Mode 1. In this embodiment mode, the shape of the booster antenna 1321 which receives a signal from the communication device varies widely depending on the transmission method. For example, when the frequency is in the long wavelength region (e.g., at a frequency band of 135 kHz or less) or the shortwave band (e.g., the 13.56 MHz band), an electromagnetic coupling method or an electromagnetic induction method is employed for the transmission method. As for the shape of the antenna, a conductor functioning as a booster antenna has a circular shape (e.g., a loop shape or a coil shape) as shown in FIG. 14. A communication range is increased by increasing the size of the booster antenna arranged circularly; thus, the booster antenna can surely communicate with the communication device. Further, the booster antenna 1321 can be provided over the integrated circuit portion 1302 as an antenna which is the same size as the integrated circuit portion 1302, which is the second feature of the invention.

As shown in the plurality of structures described above, by the first and second features of the invention, the size of the integrated circuit portion is made close to the desired size of the booster antenna; thus, the semiconductor device can surely transmit and receive a signal to and from the communication device. Further, this embodiment mode is effective in that the degree of freedom of the size and arrangement of the antenna provided over the integrated circuit portion can be increased. By provision of the integrated circuit portion which is approximately the same size as the substrate, the semiconductor device in which the integrated circuit portion, which is approximately the same size as the substrate, can be easily connected to the antenna can be obtained. At the same time, the antenna which is approximately the same size as the substrate can be formed over the integrated circuit portion which is approximately the same size as the substrate, so that a large antenna can be formed, unlike the case where an antenna is formed over an integrated circuit portion formed using a silicon wafer. Thus, the semiconductor device can surely transmit and receive a signal to and from the communication device.

Embodiment Mode 3

This embodiment mode describes a structure and an operation of a semiconductor device of the invention in the case where a battery is provided.

Figure 15:
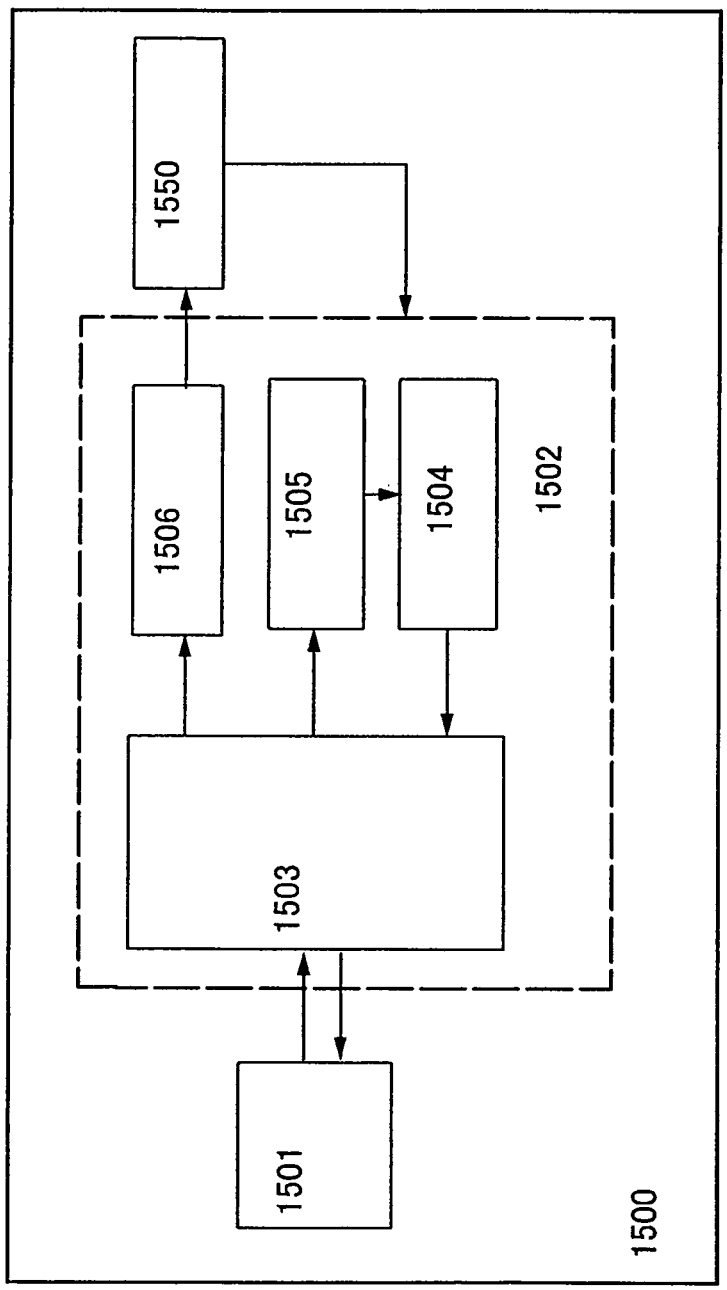
FIG. 15 illustrates a semiconductor device in Embodiment Mode 3.

A structure of a semiconductor device of the invention in the case where a battery is provided is described with reference to FIG. 15. FIG. 15 shows a structure example of a block diagram of a semiconductor device described in this embodiment mode. The semiconductor device shown in FIG. 15 includes an antenna 1501, an integrated circuit portion 1502, and a battery 1550 over a substrate 1500. The integrated circuit portion 1502 is provided with a transmission/reception circuit 1503, a memory circuit 1504, a memory control circuit 1505, and a power supply circuit 1506. The transmission/reception circuit 1503 includes a rectification circuit, a demodulation circuit, and a modulation circuit.

This embodiment mode is different from Embodiment Modes 1 and 2 in that a battery is provided. The semiconductor device described in this embodiment mode includes a battery, so that the battery can be charged using electric power of a signal by wireless communication from the outside and the semiconductor device can be driven. Thus, unlike an active semiconductor device, the semiconductor device can be continuously used without checking remaining capacity of the battery and replacing the battery. Moreover, electric power for driving the semiconductor device is stored in the battery, so that enough electric power to operate the semiconductor device can be obtained, and a communication range between the semiconductor device and the communication device can be increased. Note that the description in the aforementioned embodiment modes is applicable to the substrate 1500, the antenna 1501, the integrated circuit portion 1502, the transmission/reception circuit 1503, the memory circuit 1504, the memory control circuit 1505, and the power supply circuit 1506, and the rectification circuit, the demodulation circuit, and the modulation circuit which are included in the transmission/reception circuit 1503.

Note that a battery in this embodiment mode refers to a battery, continuous operating time of which can be recovered by charging. Although depending on applications, a battery formed in a sheet-like form is preferably used. For example, reduction in size is possible with the use of a lithium battery, preferably a lithium polymer battery using a gel electrolyte, a lithium ion battery, or the like. It is needless to say that the battery is not limited to those listed as long as it can be charged. A battery which can be charged and discharged, such as a nickel metal hydride battery, a nickel cadmium battery, an organic radical battery, a lead storage battery, an air secondary battery, a nickel-zinc battery, or a silver-zinc battery may be used. Alternatively, a capacitor such as a multilayer ceramic capacitor or an electric double layer capacitor may be used.

Next, an operation of a semiconductor device of the invention in the case where a battery is provided is described.

The battery 1550 is connected to the power supply circuit 1506. The battery 1550 is also connected to the integrated circuit portion. In the semiconductor device provided with the battery, a signal received by the semiconductor device is stored in the battery 1550 through the transmission/reception circuit 1503 and the power supply circuit 1506. Then, electric power which has been stored is intermittently supplied to the integrated circuit portion 1502 from the battery 1550. The battery is charged by reception of a wireless signal, and electric power obtained by charging is intermittently supplied to the integrated circuit portion which is a load; thus, electric power can be efficiently utilized.

In this embodiment mode, being "connected" means being electrically connected. Therefore, another element may be provided between two elements, for example.

Note that this embodiment mode can be implemented in combination with a technical element in the other embodiment modes in this specification. That is, the size of the integrated circuit portion is made close to the desired size of the antenna and the integrated circuit portion and the antenna are easily connected; thus, the semiconductor device in this embodiment mode can surely transmit and receive a signal to and from the communication device.

Embodiment Mode 4

In this embodiment mode, an example of a manufacturing method of a semiconductor device shown in the aforementioned embodiment modes is described with reference to drawings. In this embodiment mode, an element and the like included in a transmission/reception circuit of a semiconductor device are formed over the same substrate, using thin film transistors. Note that in this embodiment mode, the case is described in which an element such as a thin film transistor is once formed over a supporting substrate, and subsequently transferred to a flexible substrate so that a semiconductor device is formed. Further, in this embodiment mode, the case is described in which a plurality of (here, four-by-three) integrated circuit portions and antennas are formed over one substrate so that a plurality of semiconductor devices are formed. FIGS. 16A to 16C and 17A to 17C are schematic top plan views. FIGS. 18A to 18D, 19A to 19C, 20A to 20C, 21A and 21B, and 22 are schematic cross-sectional views along a line A-B in FIGS. 16A to 16C and 17A to 17C.

Figure 16A:
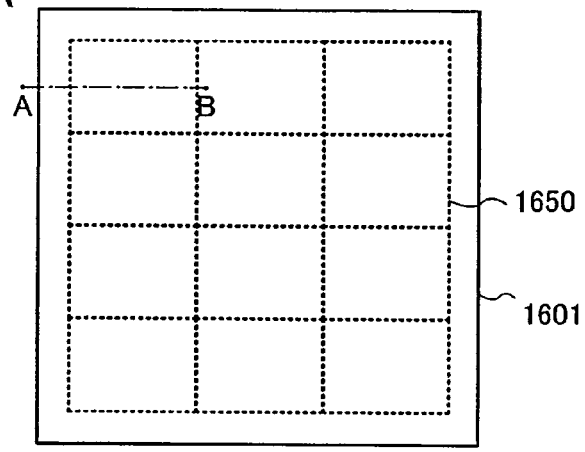
FIGS. 16A to 16C illustrate a semiconductor device in Embodiment Mode 4.

First, a separation layer 1602 is formed over one surface of a substrate 1601. Then, an insulating film 1603 serving as a base and an amorphous semiconductor film (e.g., a film containing amorphous silicon) 1604 are formed (FIGS. 18A and 16A). The separation layer 1602, the insulating film 1603, and the amorphous semiconductor film 1604 can be continuously formed. Since the separation layer 1602, the insulating film 1603, and the amorphous semiconductor film 1604 are continuously formed, they are not exposed to the atmosphere, so that mixing of an impurity can be prevented. Note that in the following steps, an integrated circuit portion and an antenna included in a semiconductor device are formed in each of a plurality of regions 1650 shown in FIG. 16A.

The substrate 1601 may be a glass substrate, a quartz substrate, a metal substrate such as a stainless steel substrate, a plastic substrate having heat resistance which can withstand processing temperature in this process, or the like. Since such a substrate has no strict limitations on the area or the shape of the substrate. Accordingly, for example, when a substrate having a rectangular shape, each side of which is 1 meter or more, is used, productivity can be significantly improved.

Such an advantage is highly favorable as compared with the case where a circular silicon substrate is used. Thus, even when an integrated circuit portion and an antenna are made larger as compared with the case of a silicon substrate, reduction in cost can be realized.

Note that the separation layer 1602 is formed over an entire surface of the substrate 1601 in this step; however, a separation layer may be formed over an entire surface of the substrate 1601, and thereafter, the separation layer 1602 may be provided as selected by a photolithography method. Further, the separation layer 1602 is formed in contact with the substrate 1601; however, an insulating film such as a silicon oxide ($SiO_x$) film, a silicon oxynitride ($SiO_xN_y$) (x>y) film, a silicon nitride ($SiN_x$) film, or a silicon nitride oxide ($SiN_xO_y$) (x>y) film may be formed in contact with the substrate 1601, and the separation layer 1602 may be formed in contact with the insulating film.

The separation layer 1602 may be formed using a metal film, a stacked-layer structure of a metal film and a metal oxide film, or the like. As the metal film, a single-layer structure or a stacked-layer structure of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy material or a compound material containing the element as its main component is used. Further, such materials can be formed by a sputtering method, various CVD methods such as a plasma CVD method, or the like. A stacked-layer structure of a metal film and a metal oxide film can be obtained by forming the aforementioned metal film and performing plasma treatment thereto under an oxygen atmosphere or an $N_2O$ atmosphere or performing heat treatment thereto under an oxygen atmosphere or an $N_2O$ atmosphere, thereby forming oxide or oxynitride of the metal film on the surface of the metal film. Moreover, when the surface of the metal film is treated with a solution having high oxidizability, such as ozone water, after the metal film is formed, oxide or oxynitride of the metal film can be formed on the surface of the metal film.

The insulating film 1603 is formed to have a single-layer structure or a stacked-layer structure of a film containing silicon oxide or silicon nitride by a sputtering method, a plasma CVD method, or the like. When the insulating film serving as the base has a two-layer structure, it is preferable that a silicon nitride oxide film be formed as a first insulating film and a silicon oxynitride film be formed as a second insulating film, for example. When the insulating film serving as the base has a three-layer structure, it is preferable that a silicon oxide film be formed as a first insulating film, a silicon nitride oxide film be formed as a second insulating film, and a silicon oxynitride film be formed as a third insulating film. Alternatively, it is preferable that an oxynitride silicon film be formed as a first insulating film, a silicon nitride oxide film be formed as a second insulating film, and a silicon oxynitride film be formed as a third insulating film. The insulating film serving as the base functions as a blocking film to prevent mixing of an impurity from the substrate 1601.

The amorphous semiconductor film 1604 is formed to a thickness of 25 to 200 nm (preferably 30 to 150 nm) by a sputtering method, an LPCVD method, a plasma CVD method, or the like. An amorphous silicon film may be formed for the amorphous semiconductor film 1604, for example.

Next, the amorphous semiconductor film 1604 is crystallized by laser light irradiation. Note that the amorphous semiconductor film 1604 may be crystallized by a method combining laser crystallization with a thermal crystallization method using RTA or an annealing furnace or with a thermal crystallization method using a metal element which promotes crystallization, for example. Thereafter, the crystalline semiconductor film is etched into a desired shape, so that crystalline semiconductor films 1604a to 1604d are formed. Then, a gate insulating film 1605 is formed so as to cover the crystalline semiconductor films 1604a to 1604d (FIG. 18B).

An example of a step of forming the crystalline semiconductor films 1604a to 1604d is briefly described below. First, an amorphous semiconductor film (e.g., an amorphous silicon film) with a thickness of 50 to 60 nm is formed by a plasma CVD method. Then, a solution containing nickel which is a metal element promoting crystallization is retained on the amorphous semiconductor film, and thereafter, dehydrogenation treatment (at 500° C. for 1 hour) and thermal crystallization treatment (at 550° C. for 4 hours) are performed so that a crystalline semiconductor film is formed. Thereafter, the crystalline semiconductor film is irradiated with laser light from a laser oscillator and etched by a photolithography method; thus, the crystalline semiconductor films 1604a to 1604d are formed. Note that crystallization of the amorphous semiconductor film may be performed only by laser light irradiation without thermal crystallization which uses a metal element promoting crystallization.

As a laser oscillator, a continuous wave laser (a CW laser) or a pulsed laser can be used. A laser beam which can be used here is a laser beam oscillated from at least one of the following lasers: a gas laser such as an Ar laser, a Kr laser, or an excimer laser; a laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with at least one of the fundamental wave of such a laser beam and the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of approximately 0.01 to 100 $MW/cm^2$ (preferably 0.1 to 10 $MW/cm^2$) is needed. Irradiation is performed with a scanning rate of approximately 10 to 2000 cm/sec. Note that the laser in which single-crystalline YA, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; an Ar ion laser; or a Ti:sapphire laser can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with a pulse during the period in which the semiconductor film is melted by the previous laser and solidified. Therefore, unlike the case where a pulsed laser with a low repetition rate is used, a solid-liquid interface in the semiconductor film can be continuously moved. Thus, crystal grains which grow continuously in the scanning direction can be obtained.

Next, the gate insulating film 1605 which covers the crystalline semiconductor films 1604a to 1604d is formed. The gate insulating film 1605 is formed to have a single-layer structure or a stacked-layer structure of a film containing silicon oxide or silicon nitride by a CVD method, a sputtering method, or the like. Specifically, the gate insulating film 1605 is formed to have a single-layer structure or a stacked-layer structure of a silicon oxide film, a silicon oxynitride film, and/or a silicon nitride oxide film.

Alternatively, the gate insulating film 1605 may be formed by oxidizing or nitriding surfaces of the crystalline semiconductor films 1604a to 1604d by high-density plasma treatment. For example, plasma treatment with a mixed gas of a rare gas such as He, Ar, Kr, or Xe, and oxygen, nitrogen oxide ($NO_2$), ammonia, nitrogen, or hydrogen is used. In this case, when plasma is excited by introduction of microwaves, plasma with low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film with a thickness of 1 to 20 nm, and typically 5 to 10 nm, is formed on the semiconductor films. Since the reaction in this case is a solid-phase reaction, interface state density between the insulating film and the semiconductor films can be quite low. Since such high-density plasma treatment directly oxidizes (or nitrides) the semiconductor films (made of crystalline silicon or polycrystalline silicon), variation in thickness of the insulating film to be formed can be greatly reduced, ideally. Further, since crystal grain boundaries of crystalline silicon are not strongly oxidized, an excellent state is obtained. That is, by the solid-phase oxidation of the surfaces of the semiconductor films by the high-density plasma treatment described here, an insulating film with good uniformity and low interface state density can be formed without excessive oxidation reaction at the crystal grain boundaries.

As the gate insulating film 1605, not only an insulating film formed by high-density plasma treatment, but also a stacked layer which is obtained by deposition of an insulating film made of silicon oxide, silicon oxynitride, silicon nitride, or the like on the above-described insulating film by a CVD method using plasma or thermal reaction may be used. In either case, a transistor which includes the insulating film formed by the high-density plasma treatment in part or the whole of its gate insulating film can have small variation in characteristics.

In addition, the crystalline semiconductor films 1604a to 1604d, which are obtained by irradiation of a semiconductor film with continuous wave laser light or laser light oscillated with a repetition rate of 10 MHz or more and scanning of the semiconductor film in one direction to crystallize the semiconductor film, have characteristics that their crystals grow in the laser light scanning direction. A transistor is arranged so that its channel length direction (direction in which carriers flow when a channel formation region is formed) is aligned with the scanning direction, and the above-described gate insulating film is combined; thus, a thin film transistor (TFT) with high electron field effect mobility and small variation in characteristics can be obtained.

Next, a first conductive film and a second conductive film are stacked over the gate insulating film 1605. Here, the first conductive film is formed to a thickness of 20 to 100 nm by a plasma CVD method, a sputtering method, or the like. The second conductive film is formed to a thickness of 100 to 400 nm. Each of the first and second conductive films is formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing the element as its main component. Alternatively, each of the first and second conductive films may be formed of a semiconductor material typified by polycrystalline silicon doped with an impurity element such as phosphorus. Examples of a combination of the first and second conductive films include a tantalum nitride film and a tungsten film; a tungsten nitride film and a tungsten film; and a molybdenum nitride film and a molybdenum film. Tungsten and tantalum film have high heat resistance. Therefore, after the first and second conductive films are formed, thermal treatment for heat activation can be applied. Further, in the case where a three-layer structure instead of a two-layer structure is employed, it is preferable to use a stacked-layer structure of a molybdenum film, an aluminum film, and a molybdenum film.

Next, a resist mask is formed by a photolithography method, and etching treatment is performed for forming a gate electrode and a gate wiring. Accordingly, gate electrodes 1607 are formed above the crystalline semiconductor films 1604a to 1604d.

Next, a resist mask is formed by a photolithography method, and the crystalline semiconductor films 1604a to 1604d are doped with an impurity element imparting n-type conductivity at low concentration by an ion doping method or an ion implantation method. As the impurity element imparting n-type conductivity, an element belonging to Group 15, such as phosphorus (P) or arsenic (As), can be used.

Next, an insulating film is formed so as to cover the gate insulating film 1605 and the gate electrodes 1607. The insulating film is formed to have a single-layer structure or a stacked-layer structure of a film containing an inorganic material such as silicon, silicon oxide, or silicon nitride, and/or a film containing an organic material such as an organic resin by a plasma CVD method, a sputtering method, or the like. Then, the insulating film is etched as selected by anisotropic etching mainly in a perpendicular direction, so that insulating films 1608 (also referred to as sidewalls) which are in contact with side surfaces of the gate electrodes 1607 are formed. The insulating films 1608 are used as doping masks for forming LDD (lightly doped drain) regions in a later step.

Next, the crystalline semiconductor films 1604a to 1604d are doped with an impurity element imparting n-type conductivity, using a resist mask formed by a photolithography method, the gate electrodes 1607, and the insulating films 1608 as masks. Thus, a channel formation region 1606a, a first impurity region 1606b, and a second impurity region 1606c are formed (FIG. 18C). The first impurity region 1606b functions as a source region or a drain region of a thin film transistor. The second impurity region 1606c functions as an LDD region. A concentration of the impurity element contained in the second impurity region 1606c is lower than a concentration of the impurity element contained in the first impurity region 1606b.

Figure 16B:
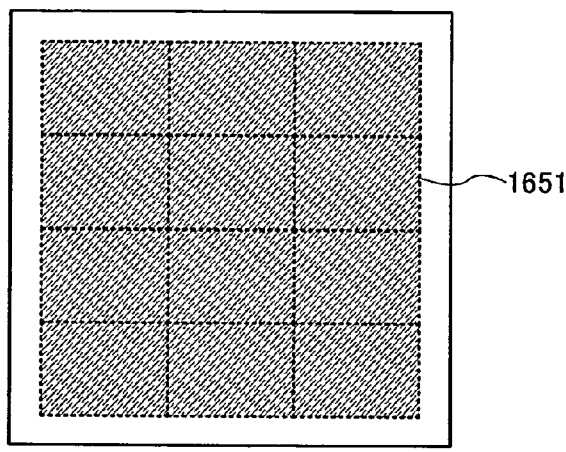

Next, an insulating film having a single-layer structure or a stacked-layer structure is formed so as to cover the gate electrodes 1607, the insulating films 1608, and the like. Then, conductive films 1631 each functioning as a source electrode or a drain electrode of the thin film transistor are formed over the insulating film. Thus, an element layer 1651 including thin film transistors 1630a to 1630d can be obtained (FIGS. 18D and 16B). Note that an element such as the thin film transistor may be provided over an entire surface of the regions 1650, or may be provided over a portion except a part (e.g., a center portion) of the regions 1650 as shown in the aforementioned embodiment mode.

The insulating film is formed to have a single-layer structure or a stacked-layer structure of an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. Here, an example in which the insulating film has a two-layer structure is shown, and a silicon nitride oxide film can be formed as a first insulating film 1609 and a silicon oxynitride film can be formed as a second insulating film 1610.

Note that before the insulating-films 1609 and 1610 are formed or after at least one of the insulating films 1609 and 1610 is formed, heat treatment is preferably applied for recovery of the crystallinity of the crystalline semiconductor films 1604a to 1604d, activation of the impurity elements added to the semiconductor films, or hydrogenation of the semiconductor films. For the heat treatment, thermal annealing, a laser annealing method, an RTA method, or the like is preferably employed.

After the insulating films 1609 and 1610, and the like are etched by a photolithography method and contact holes which expose the first impurity regions 1606b are formed, a conductive film is formed so as to fill the contact holes. Then, the conductive film is etched as selected to form the conductive films 1631. Note that before the conductive film is formed, silicide may be formed on surfaces of the crystalline semiconductor films 1604a to 1604d which are exposed at the contact holes.

The conductive film 1631 is formed to have a single-layer structure or a stacked-layer structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the element as its main component. An alloy material containing aluminum as its main component corresponds to, for example, an alloy material which contains aluminum as its main component and also contains nickel, or an alloy material which contains aluminum as its main component and also contains nickel and at least one of carbon and silicon. The conductive film 1631 is preferably formed to have a stacked-layer structure of a barrier film, an aluminum-silicon (Al—Si) film, and a barrier film or a stacked-layer structure of a barrier film, an aluminum silicon (Al—Si) film, a titanium nitride film, and a barrier film, for example. Note that the barrier film corresponds to a thin film formed of titanium, nitride of titanium, molybdenum, or nitride of molybdenum. Aluminum and aluminum silicon, which have a low resistance value and are inexpensive, are the most suitable materials for forming the conductive films 1631. When upper and lower barrier layers are provided, generation of hillocks of aluminum or aluminum silicon can be prevented. Further, when a barrier film is formed of titanium which is an element having a high reducing property, even if a thin natural oxide film is formed on the crystalline semiconductor film, the natural oxide film can be reduced, and a favorable contact between the conductive film and the crystalline semiconductor film can be obtained.

Next, an insulating film 1611 is formed so as to cover the conductive films 1631. An opening portion 1612 is formed in the insulating film 1611 (FIG. 19A). Here, the opening portion 1612 is formed so that the conductive film 1631 functioning as the source electrode or the drain electrode of the thin film transistor 1630d is exposed. The insulating film 1611 is formed to have a single-layer structure or a stacked-layer structure of an inorganic material and/or an organic material by a CVD method, a sputtering method, an SOG method, a droplet discharging method, a screen printing method, or the like. The insulating film 1611 is preferably formed to a thickness of 0.75 to 3 μm.

Next, a thin metal film 1613 is formed on a surface of the insulating film 1611 (FIG. 19B). The metal film 1613 can be formed by performing roughening treatment on the surface of the insulating film 1611 and subsequently performing plating treatment. For example, after unevenness is formed on the surface of the insulating film 1611 by chemical roughening, copper (Cu) plating may be performed without an electric field. Note that plating treatment is not limited to use copper, and nickel (Ni), gold (Au), platinum (Pt), silver (Ag), or the like may be used.

Next, a resist 1614 is formed as selected over the metal film 1613 (FIG. 19C). The resist 1614 is formed in regions other than a region in which a conductive film is to be formed.

Next, a conductive film 1615 is formed over parts of the metal film 1613 which are not covered with the resist 1614 (FIG. 20A). The conductive film 1615 can be formed by plating treatment. For example, the conductive film 1615 can be formed by electroplating treatment using copper (Cu). Note that plating treatment is not limited to use copper, and nickel (Ni), gold (Au), platinum (Pt), silver (Ag), or the like may be used.

Figure 16C:
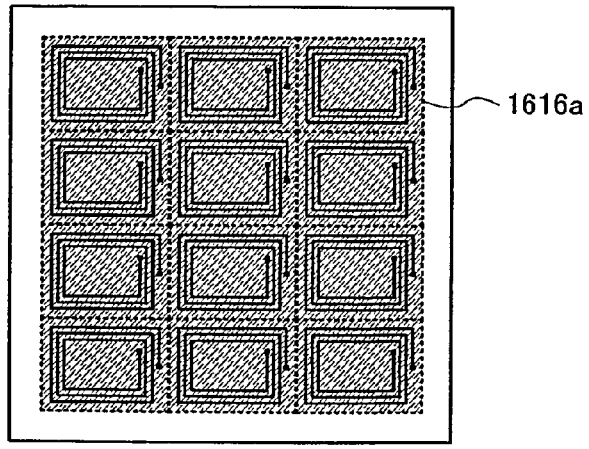

Next, the resist 1614 and parts of the metal film 1613 which are not covered with the conductive film 1615 are removed as selected, so that a conductive film 1616a functioning as an on-chip antenna and a conductive film 1616b functioning as a wiring in the element such as the thin film transistor are formed (FIGS. 20B and 16C). That is, in this embodiment mode, the conductive film functioning as the antenna and part of the conductive film functioning as the wiring are formed at the same time. It is needless to say that the conductive film 1616a functioning as the antenna and the conductive film 1616b functioning as the wiring may be separately formed.

Note that a method of forming the conductive films 1616a and 1616b is not limited to that shown in FIGS. 19B, 19C, 20A, and 20B. Alternatively, the conductive films may be formed by a CVD method, a sputtering method, or the like, and subsequently, processed by a photolithography method to form the conductive films 1616a and 1616b, similarly to the method of forming the conductive film 1631. Further alternatively, a pattern may be directly formed by a droplet discharging method, a screen printing method, or the like. When the conductive films 1616a and 1616b are formed by a screen printing method, the conductive films 1616a and 1616b are formed, for example, as follows: after the state shown in FIG. 19A is completed, conductive paste made of silver or the like is formed as selected over the insulating film 1611, and then, heat treatment at 50 to 350° C. is performed. Note that when the conductive films 1616a and 1616b are formed by a sputtering method with the use of a high-purity aluminum film (a purity of 2 N or more), a stacked-layer film of titanium and aluminum, a stacked-layer film of titanium and copper, or the like, a process of forming a wiring of the thin film transistor can be performed at the same time. Thus, productivity can be improved.

Next, an element formation layer including the thin film transistors 1630a to 1630d and the conductive film 1616a functioning as the antenna is separated from the substrate 1601.

Figure 17A:
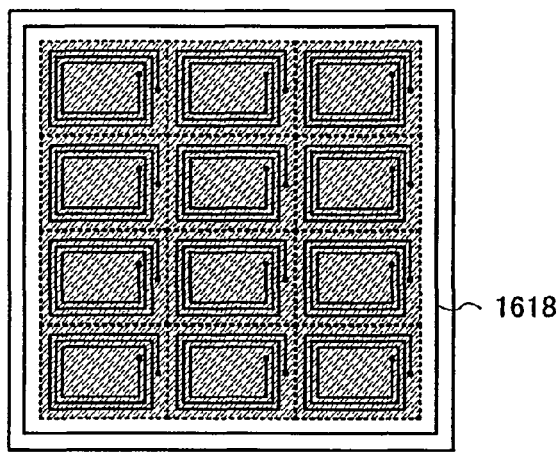
FIGS. 17A to 17C illustrate a semiconductor device in Embodiment Mode 4.
Figure 21A:
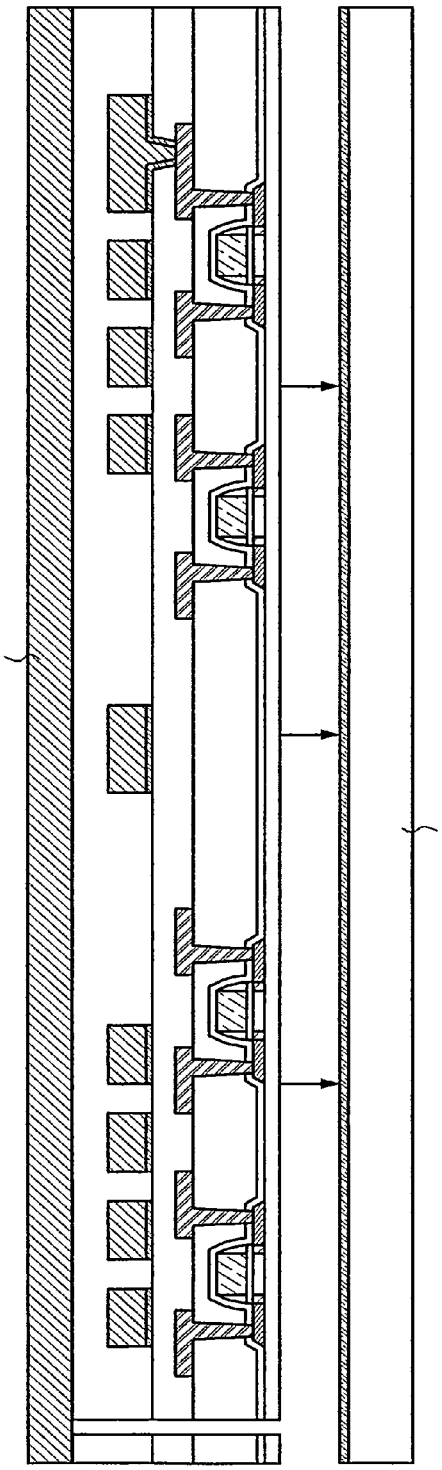
FIGS. 21A and 21B illustrate a semiconductor device in Embodiment Mode 4.

First, an insulating film 1617 is formed so as to cover the conductive films 1616a and 1616b, and then, an opening portion 1618 is formed by laser light irradiation (FIGS. 20C and 17A). Next, one surface of an element formation layer 1619 (here, a surface of the insulating film 1617) is attached to a first sheet material 1620, and then, the element formation layer 1619 is separated from the substrate 1601 by using physical force (FIG. 21A). As the first sheet material 1620, a hot melt film or the like can be used. Further, when the first sheet material 1620 is separated in a later step, a heat separation tape whose adhesive strength is reduced by application of heat can be used.

Note that when separation of the element formation layer is performed while a surface at which separation is performed is wet by water or a solution such as ozone water, the elements such as the thin film transistors 1630a to 1630d can be prevented from being destroyed by static electricity or the like. Further, by reusing the substrate 1601 after the element formation layer 1619 is separated, cost reduction can be realized.

Figure 17B:
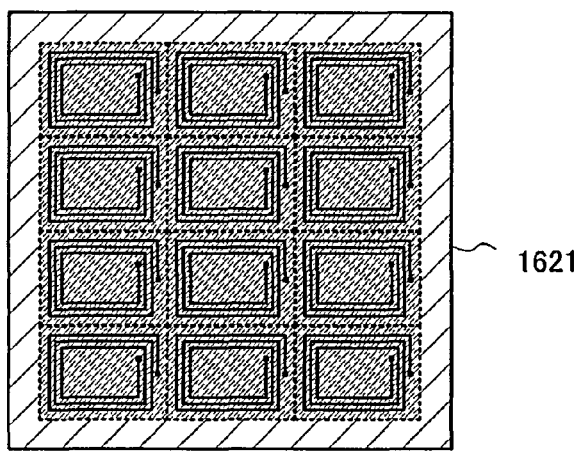
Figure 21B:
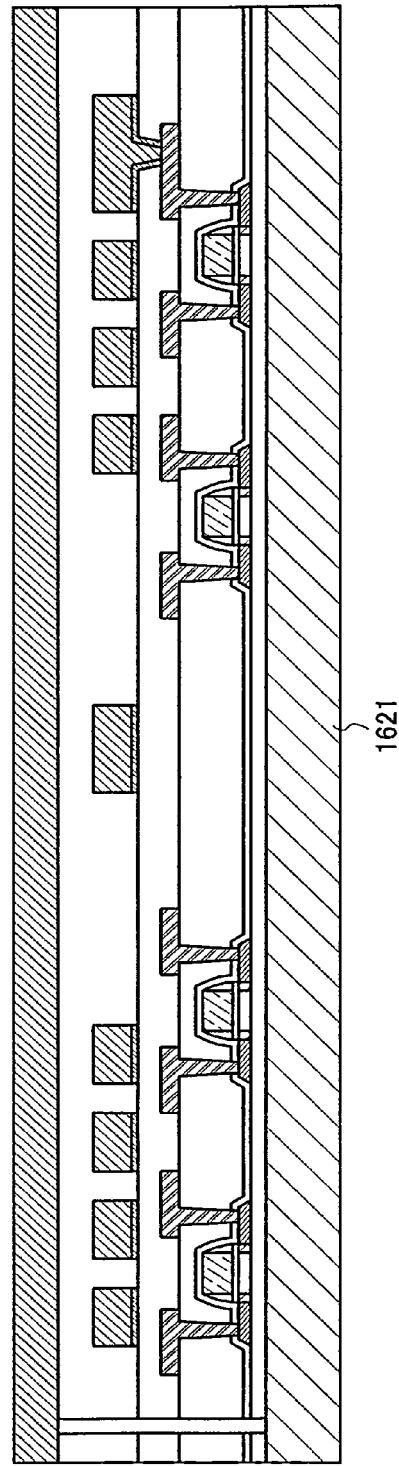

Next, a second sheet material 1621 is provided on the other surface of the element formation layer 1619 (the surface exposed by separation from the substrate 1601) (FIGS. 21B and 17B). As the second sheet material 1621, a hot melt film or the like is used and can be attached to the other surface of the element formation layer 1619 by one or both of heat treatment and pressure treatment. Further, when a heat separation tape is used as the first sheet material 1620, the first sheet material 1620 can be separated using heat applied for attaching the second sheet material 1621.

Figure 17C:
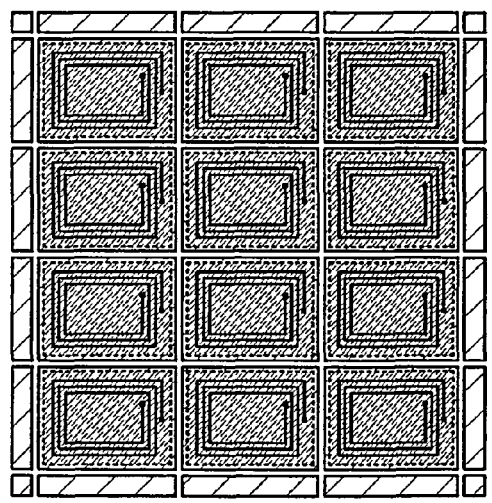
Figure 22:
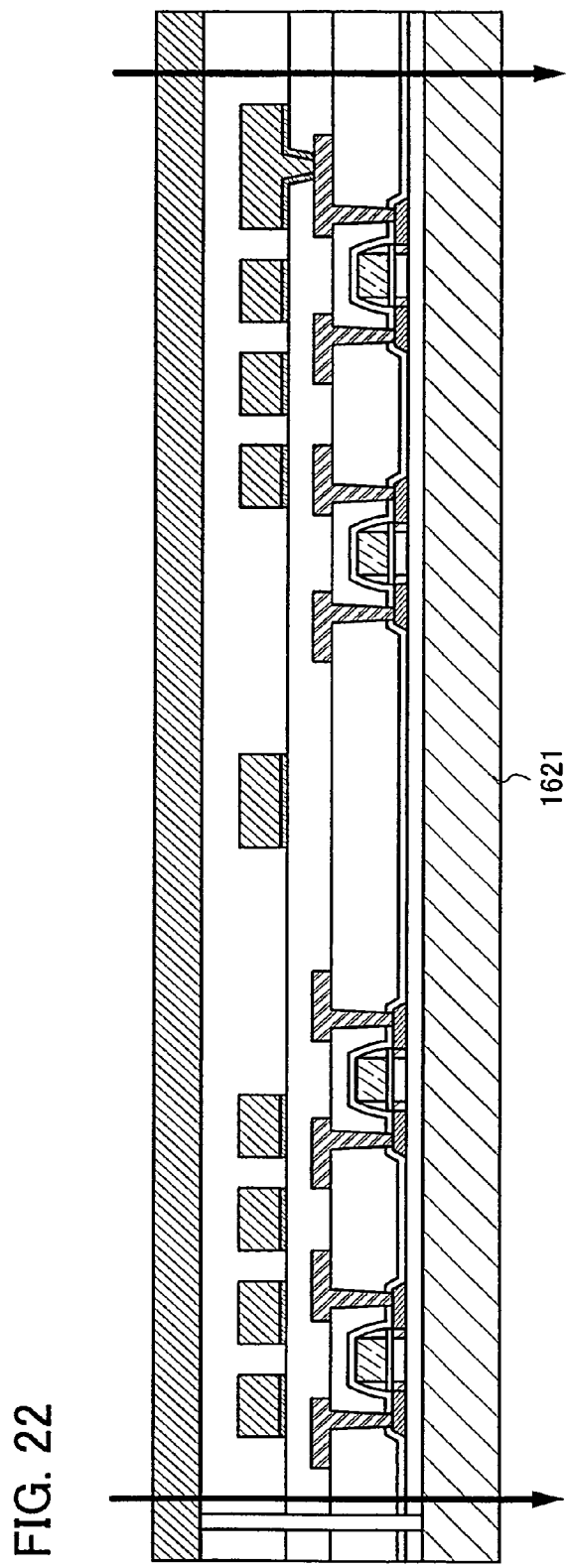
FIG. 22 illustrates a semiconductor device in Embodiment Mode 4.

Next, the element formation layer 1619 provided over the second sheet material 1621 is selectively cut by dicing, scribing, a laser cutting method, or the like; thus, a plurality of semiconductor devices can be obtained (FIGS. 22 and 17C). When a flexible substrate made of plastic or the like is used as the second sheet material 1621, flexible semiconductor devices can be formed.

Note that this embodiment mode shows the case where the flexible semiconductor device is formed by separation from the substrate 1601 after the elements such as the thin film transistor and the antenna are formed over the substrate 1601; however, the invention is not limited thereto. For example, when the steps shown in FIGS. 18A to 18D, 19A to 19C, 20A, and 20B are employed without provision of the separation layer 1602 over the substrate 1601, a semiconductor device in which elements such as a thin film transistor and an antenna are formed over the substrate 1601 can be formed.

Note that this embodiment mode can be implemented in combination with a technical element in the other embodiment modes in this specification. That is, the size of the integrated circuit portion is made close to the desired size of the antenna and the integrated circuit portion and the antenna are easily connected; thus, the semiconductor device in this embodiment mode can surely transmit and receive a signal to and from the communication device.

Embodiment Mode 5

In this embodiment mode, a manufacturing method of a semiconductor device, which is different from that shown in the aforementioned embodiment mode, is described with reference to drawings. Specifically, a manufacturing method of a semiconductor device provided with an external antenna (a booster antenna) is described.

First, the steps shown in FIGS. 18A to 18D, 19A to 19C, 20A to 20C, and 21A are performed. Next, at the same time as or after provision of the second sheet material 1621 on the other surface of the element formation layer 1619, the first sheet material 1620 is separated (FIG. 23A).

Figure 26A:
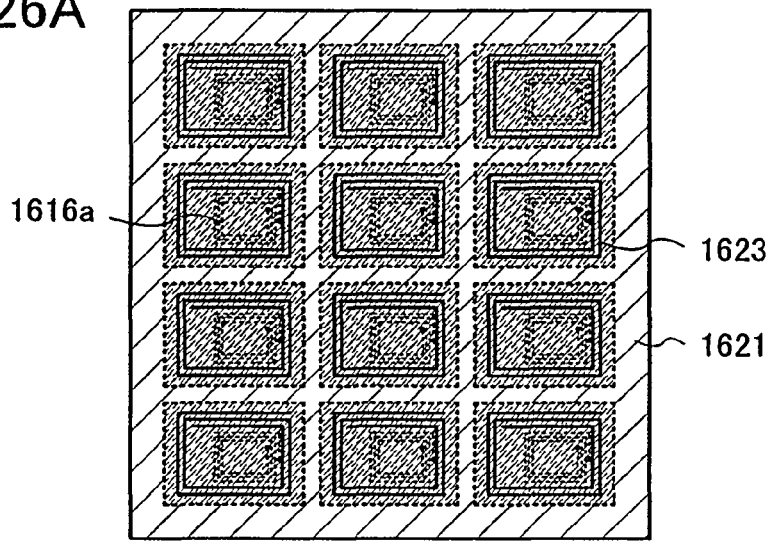
FIGS. 26A and 26B each illustrate a semiconductor device in Embodiment Mode 5.

Next, a substrate 1622 provided with a conductive film 1623 functioning as a booster antenna is attached on one surface of the element formation layer 1619 (here, the surface of the insulating film 1617) (FIGS. 23B and 26A). Here, the substrate 1622 provided with the conductive film 1623 is attached to one surface of the element formation layer 1619 by using an adhesive resin 1624.

Note that the conductive film 1623 provided on the substrate 1622 is provided not to be electrically connected to the elements provided in the element formation layer 1619. That is, in the semiconductor device shown in this embodiment mode, the conductive film 1616a is an on-chip antenna, and the conductive film, 1623 is an external antenna (a booster antenna). Accordingly, the antenna formed of the conductive film 1623 is utilized for transmitting and receiving information to and from the outside (a communication device), and the antenna formed of the conductive film 1623 and the antenna formed of the conductive film 1616a exchange information. Thus, the semiconductor device can communicate with the outside.

Note that FIGS. 23A and 23B show the example in which the conductive film 1623 functioning as the booster antenna is provided above the thin film transistor; however, the conductive film 1623 may be provided below the thin film transistor because it is not necessarily electrically connected to the elements in the element formation layer 1619. A manufacturing method in this case is briefly described with reference to FIGS. 24A and 24B.

Figure 24A:
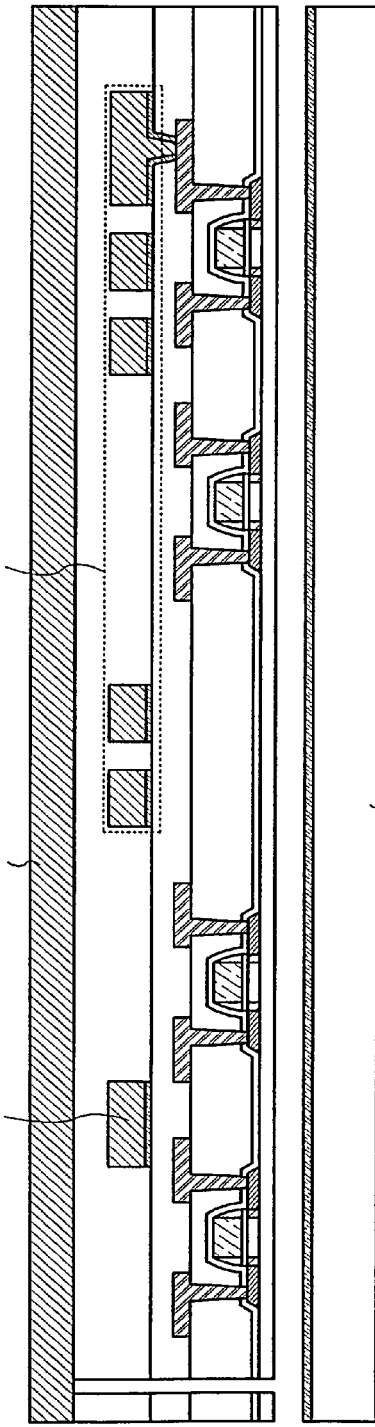
FIGS. 24A and 24B illustrate a semiconductor device in Embodiment Mode 5.
Figure 24B:
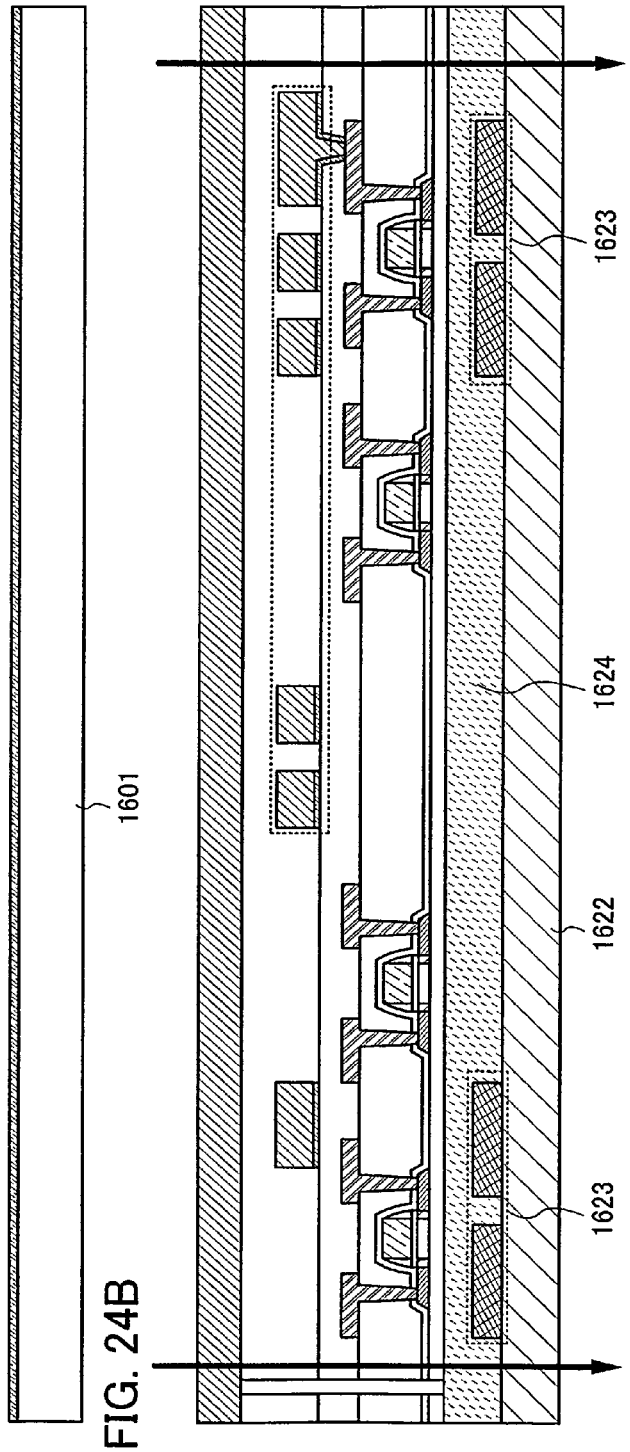
Figure 26B:
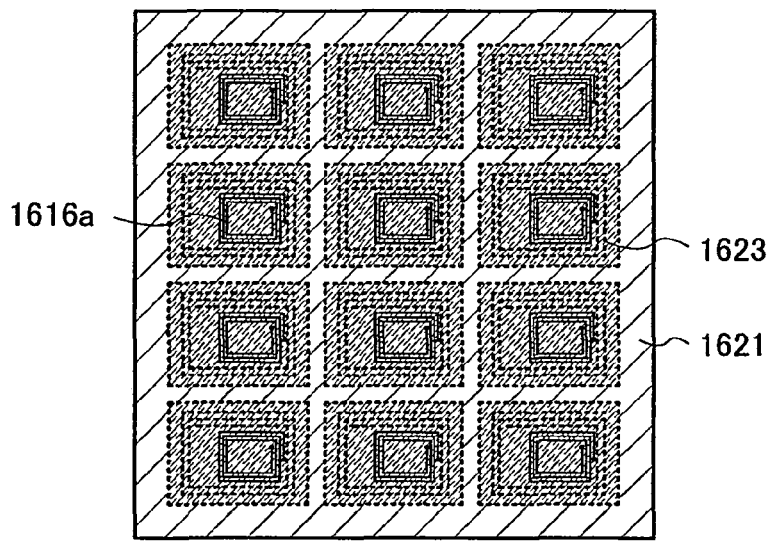

First, the steps shown in FIGS. 18A to 18D, 19A to 19C, 20A to 20C, and 21A are performed. Then, the element formation layer 1619 is separated from the substrate 1601 (FIG. 24A). Next, the substrate 1622 provided with the conductive film 1623 functioning as the booster antenna is attached to the other surface of the element formation layer 1619 (the surface exposed by separation from the substrate 1601) (FIGS. 24B and 26B). Here, the substrate 1622 provided with the conductive film 1623 is attached to the other surface of the element formation layer 1619 by using the adhesive resin 1624.

As described above, in the semiconductor device shown in this embodiment mode, an area of a surface of an integrated circuit portion included in the semiconductor device and an area of the booster antenna are designed so as to be approximately the same as an area of a surface of the substrate 1622. With such a structure, even when a position (layout) of the conductive film 1623 functioning as the booster antenna is limited due to a wiring of the thin film transistor and the like (e.g., when the conductive films 1616a and 16161b are formed over the same film), a communication range can be maintained.

Note that this embodiment mode can be implemented in combination with a technical element in the other embodiment modes in this specification. That is, the size of the integrated circuit portion is made close to the desired size of the antenna and the integrated circuit portion and the antenna are easily connected; thus, the semiconductor device in this embodiment mode can surely transmit and receive a signal to and from the communication device.

Embodiment Mode 6

In this embodiment mode, applications of the semiconductor device of the invention are described. The semiconductor device of the invention can be used for an so-called IC label or IC card provided for, for example, electronic devices such as digital video cameras, computers, portable information terminals (e.g., mobile computers, mobile phones, mobile game machines, and electronic books), and image reproducing devices provided with recording media (specifically, a device which reproduces a recording medium such as a digital versatile disc (DVD) and has a display for displaying the reproduced image), bills, coins, securities, bearer bonds, documents (e.g., driver's licenses and resident's cards), packaging containers (e.g., wrapping paper and bottles), storage media (e.g., DVD software and video tapes), vehicles (e.g., bicycles), personal belongings (e.g., bags and glasses), foods, plants, animals, human bodies, clothing, everyday articles, and identification tags on luggage.

Note that in this embodiment mode, the IC card refers to a card which is formed by embedding a thin semiconductor device (an IC chip) in a plastic card so that information can be stored. There are various modes of the semiconductor device of the invention, and a label-shaped semiconductor device is referred to as an IC label.

In this embodiment mode, application examples of IC labels and IC cards each including the semiconductor device of the invention and products to which the IC label or the IC card is attached are described with reference to FIGS. 25A to 25E.

Figure 25A:
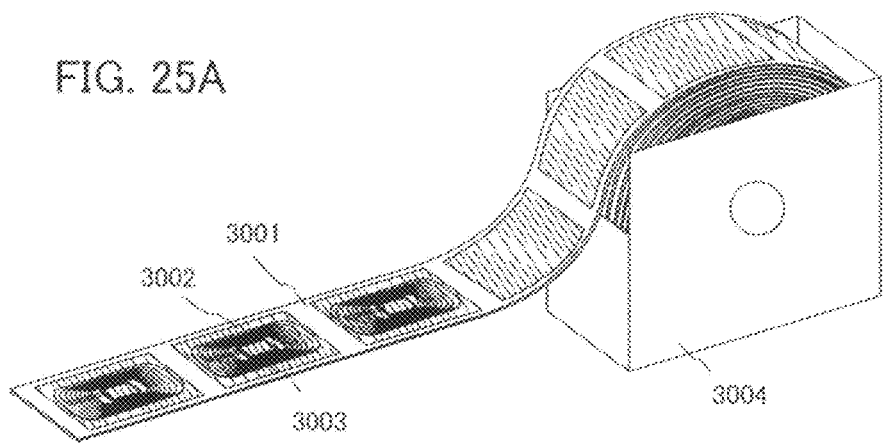
FIGS. 25A to 25E each illustrate a semiconductor device in Embodiment Mode 6.

FIG. 25A shows an example of an IC label including the semiconductor device according to the invention. A plurality of IC labels 3003 each including a semiconductor device 3002 are formed over a label board 3001 (separate paper). The IC labels 3003 are stored in a box 3004. Further, on the IC label 3003, information on a product or service (e.g., a product name, a brand, a trademark, a trademark owner, a seller, or a manufacturer) is written. Meanwhile, an ID number which is unique to the product (or the type of product) is assigned to the semiconductor device incorporated in the IC label, so that forgery, infringement of intellectual property rights such as patent rights and trademark rights, and illegal behavior such as unfair competition can easily be detected. Moreover, a large amount of information which cannot be clearly written on a container of the product or the label (e.g., production area, selling area, quality, raw materials, efficacy, applications, quantity, shape, price, production method, directions for use, time of production, time of use, expiration date, instructions for the product, or information on the intellectual property of the product) can be input to the semiconductor device. A client or a consumer can access the information using a simple reader. Further, the semiconductor device is structured such that a producer of a product can easily rewrite or erase the information, for example, but a client or a consumer cannot.

Figure 25B:
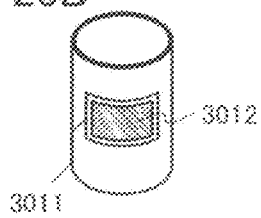

FIG. 25B shows a label-shaped IC label 3011 including the semiconductor device of the invention. When a product is provided with the IC label 3011, product management can be simplified. For example, when the product is stolen, the product can be traced, so that the culprit can be identified quickly. Thus, by provision of the IC label, products which are superior in so-called traceability can be distributed. Further, in the invention, a thin film transistor can be included as an integrated circuit portion and a thin-film secondary battery or a capacitor can be included as a battery, as described in the aforementioned embodiment modes. Accordingly, as shown in FIG. 25B, the invention can also be useful for attachment to a product with a curved shape.

Figure 25C:
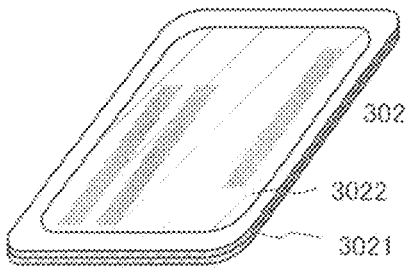

FIG. 25C shows an example of a completed IC card 3021 including the semiconductor device of the invention. The IC card 3021 may be any kind of card: a cash card, a credit card, a prepaid card, an electronic ticket, electronic money, a telephone card, a membership card, or the like.

Figure 25D:
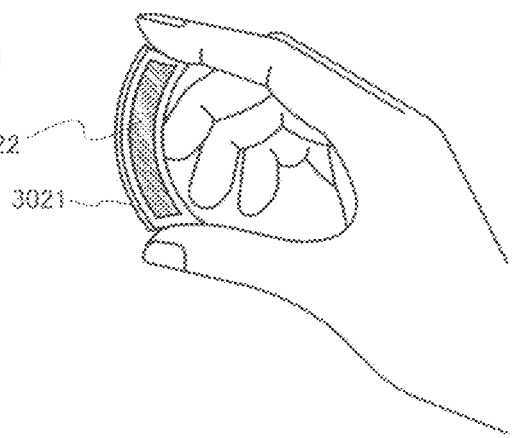

Note that in the IC card including the semiconductor device of the invention, which is shown in FIG. 25C, a thin film transistor can be included as an integrated circuit portion, and a thin-film secondary battery or a capacitor can be included as a battery. Accordingly, the invention is very useful because the IC card can be used even when it is transformed into a bent shape as shown in FIG. 25D.

Figure 25E:

FIG. 25E shows a completed bearer bond 3031. The semiconductor device of the invention is embedded in the bearer bond 3031 and is protected by a resin by which the shape of the periphery of the semiconductor device is formed. Here, the resin is filled with a filler. The bearer bond 3031 can be formed in the same manner as the IC label or the IC card according to the invention. Note that the aforementioned bearer bond may be, but is not limited to, a stamp, a ticket, an admission ticket, a merchandise coupon, a book coupon, a stationery coupon, a beer coupon, a rice coupon, various types of gift coupon, or various types of service coupon. Further, when a semiconductor device 3032 of the invention is provided for bills, coins, securities, bearer bonds, documents, or the like, an authentication function can be provided, and forgery can be prevented by using the authentication function.

As described above, the IC label and the IC card, each of which includes the semiconductor device of the invention, can be provided for any product (including creatures).

Note that this embodiment mode can be implemented in combination with a technical element in other embodiment modes in this specification. That is, the size of the integrated circuit portion is made close to the desired size of the antenna and the integrated circuit portion and the antenna are easily connected; thus, the semiconductor device in this embodiment mode can surely transmit and receive a signal to and from the communication device.

This application is based on Japanese Patent Application serial No. 2007-030491 filed with Japan Patent Office on Feb. 9, 2007, the entire contents of which are hereby incorporated by reference.

What is claimed is:

1. A semiconductor device comprising:
   an integrated circuit portion comprising a thin film transistor, and formed over a substrate;
   an antenna formed over the substrate, overlapping the integrated circuit portion, and electrically connected to the thin film transistor; and
   a region which does not include a wiring and a semiconductor layer, and which is located inside the integrated circuit portion,
   wherein the region belongs to a same plane as the thin film transistor;
   wherein an outline of the integrated circuit portion defines an outline of the entire region; and
   wherein an area of the substrate occupied by the integrated circuit portion is 0.5 to 1 times as large as a top surface of the substrate.

2. The semiconductor device according to claim 1, wherein the area over the substrate occupied by the integrated circuit portion is 0.7 to 1 times as large as the top surface of the substrate.

3. The semiconductor device according to claim 1, wherein the area over the substrate occupied by the integrated circuit portion is 0.9 to 1 times as large as the top surface of the substrate.

4. The semiconductor device according to claim 1, further comprising a battery capable of being charged by reception of a wireless signal.

5. The semiconductor device according to claim 1, wherein the integrated circuit portion includes a transmission/reception circuit, a power supply circuit, a memory control circuit, and a memory circuit.

6. The semiconductor device according to claim 1, wherein the region overlaps a substantial portion of a surface defined by an inner perimeter of the antenna.

7. The semiconductor device according to claim 1, wherein the substrate is made of a material other than a semiconductor material.

8. The semiconductor device according to claim 1, wherein the integrated circuit portion is continuously formed except in the region.

9. A semiconductor device comprising:
   a first integrated circuit portion and a second integrated circuit portion formed over a substrate, each of the first integrated circuit portion and the second integrated circuit portion comprising a thin film transistor;
   an antenna formed on the substrate, overlapping the first integrated circuit portion and the second integrated circuit portion, and connected to each of the first integrated circuit portion and the second integrated circuit portion; and
   a region which does not include a wiring and a semiconductor layer, and which is located between the first integrated circuit portion and the second integrated circuit portion,
   wherein the region belongs to a same plane as the thin film transistor;
   wherein an outline of the first integrated circuit portion and an outline of the second integrated circuit portion substantially define an outline of the entire region; and
   wherein an area of the substrate occupied by the first integrated circuit portion and the second integrated circuit portion is 0.5 to 1 times as large as a top surface of the substrate.

10. The semiconductor device according to claim 9, wherein the area over the substrate occupied by the first integrated circuit portion and the second integrated circuit portion is 0.7 to 1 times as large as the top surface of the substrate.

11. The semiconductor device according to claim 9, wherein the area over the substrate occupied by the first integrated circuit portion and the second integrated circuit portion is 0.9 to 1 times as large as the top surface of the substrate.

12. The semiconductor device according to claim 9, further comprising a battery capable of being charged by reception of a wireless signal.

13. The semiconductor device according to claim 9, wherein one of the first integrated circuit portion and the second integrated circuit portion includes a transmission/reception circuit, a power supply circuit, a memory control circuit, and a memory circuit.

14. A semiconductor device comprising:
   an integrated circuit portion formed over a substrate, and comprising a thin film transistor;
   a first antenna and a second antenna formed over the substrate, overlapping the integrated circuit portion, and connected to the integrated circuit portion; and
   a first region and a second region which do not include a wiring and a semiconductor layer, which are located inside the integrated circuit portion, and which overlap an inner portion of the first antenna and an inner portion of the second antenna, respectively;
   wherein the first region and the second region belong to a same plane as the thin film transistor;
   wherein an outline of the integrated circuit portion defines an outline of the entire first region and an outline of the entire second region; and
   wherein an area of the substrate occupied by the integrated circuit portion is 0.5 to 1 times as large as a top surface of the substrate.

15. The semiconductor device according to claim 14, wherein the area over the substrate occupied by the integrated circuit portion is 0.7 to 1 times as large as the top surface of the substrate.

16. The semiconductor device according to claim 14, wherein the area over the substrate occupied by the integrated circuit portion is 0.9 to 1 times as large as the top surface of the substrate.

17. The semiconductor device according to claim 14, further comprising a battery capable of being charged by reception of a wireless signal.

18. The semiconductor device according to claim 14, wherein the integrated circuit portion includes a transmission/reception circuit, a power supply circuit, a memory control circuit, and a memory circuit.

19. A semiconductor device comprising:
an integrated circuit portion formed over a first substrate, and comprising a thin film transistor;
an antenna formed over the first substrate, overlapping the integrated circuit portion, and connected to the thin film transistor;
a region which does not include a wiring and a semiconductor layer, and which is located inside the integrated circuit portion; and
a booster antenna formed over a second substrate,
wherein the first substrate overlaps the second substrate;
wherein the region belongs to a same plane as the thin film transistor;
wherein an outline of the integrated circuit portion defines an outline of the entire region; and
wherein an area of the first substrate occupied by the integrated circuit portion is 0.5 to 1 times as large as a top surface of the first substrate.

20. The semiconductor device according to claim 19, wherein the area over the first substrate occupied by the integrated circuit portion is 0.7 to 1 times as large as the top surface of the first substrate.

21. The semiconductor device according to claim 19, wherein the area over the first substrate occupied by the integrated circuit portion is 0.9 to 1 times as large as the top surface of the first substrate.

22. The semiconductor device according to claim 19, further comprising a battery capable of being charged by reception of a wireless signal.

23. The semiconductor device according to claim 19, wherein the integrated circuit portion includes a transmission/reception circuit, a power supply circuit, a memory control circuit, and a memory circuit.

24. The semiconductor device according to claim 19,
wherein the booster antenna is not electrically connected to the antenna but is magnetic-field coupled to the antenna.

25. A semiconductor device comprising:
a first integrated circuit portion and a second integrated circuit portion formed over a first substrate, each of the first integrated circuit portion and the second integrated circuit portion comprising a thin film transistor;
an antenna formed over the first substrate, overlapping the first integrated circuit portion and the second integrated circuit portion, and connected to each of the first integrated circuit portion and the second integrated circuit portion;
a region which does not include a wiring and a semiconductor layer, and which is located between the first integrated circuit portion and the second integrated circuit portion; and
a booster antenna formed over a surface of a second substrate,
wherein the first substrate overlaps the second substrate;
wherein the region belongs to a same plane as the thin film transistor;
wherein an outline of the first integrated circuit portion and an outline of the second integrated circuit portion substantially define an outline of the entire region; and
wherein an area of the first substrate occupied by the first integrated circuit portion and the second integrated circuit portion is 0.5 to 1 times as large as a top surface of the first substrate.

26. The semiconductor device according to claim 25, wherein the area over the first substrate occupied by the first integrated circuit portion and the second integrated circuit portion is 0.7 to 1 times as large as the top surface of the first substrate.

27. The semiconductor device according to claim 25, wherein the area over the first substrate occupied by the first integrated circuit portion and the second integrated circuit portion is 0.9 to 1 times as large as the top surface of the first substrate.

28. The semiconductor device according to claim 25, further comprising a battery capable of being charged by reception of a wireless signal.

29. The semiconductor device according to claim 25, wherein one of the first integrated circuit portion and the second integrated circuit portion includes a transmission/reception circuit, a power supply circuit, a memory control circuit, and a memory circuit.

30. The semiconductor device according to claim 25,
wherein the booster antenna is not electrically connected to the antenna but is magnetic-field coupled to the antenna.

31. A semiconductor device comprising:
an integrated circuit portion formed over a surface of a first substrate, and comprising a thin film transistor;
a first antenna and a second antenna formed over the first substrate, overlapping the integrated circuit portion, and each connected to the integrated circuit portion;
a first region and a second region which do not include a wiring and a semiconductor layer, which are located inside the integrated circuit portion, and which overlap an inner portion of the first antenna and an inner portion of the second antenna, respectively; and
a booster antenna formed over a surface of a second substrate,
wherein the first substrate overlaps the second, substrate,
wherein the first region and the second region belong to a same plane as the thin film transistor;
wherein an outline of the integrated circuit portion defines an outline of the entire first region and an outline of the entire second region; and
wherein an area of the first substrate occupied by the integrated circuit portion is 0.5 to 1 times as large as a top surface of the first substrate.

32. The semiconductor device according to claim 31, wherein the area over the first substrate occupied by the integrated circuit portion is 0.7 to 1 times as large as the top surface of the first substrate.

33. The semiconductor device according to claim 31, wherein the area over the first substrate occupied by the integrated circuit portion is 0.9 to 1 times as large as the top surface of the first substrate.

34. The semiconductor device according to claim 31, further comprising a battery capable of being charged by reception of a wireless signal.

35. The semiconductor device according to claim 31, wherein the integrated circuit portion includes a transmission/reception circuit, a power supply circuit, a memory control circuit, and a memory circuit.

36. The semiconductor device according to claim 31, wherein the booster antenna is not electrically connected to the first antenna and to the second antenna but is magnetic-field coupled to the first antenna and to the second antenna.

* * * * *

UNITED STATES PATENT AND TRADEMARK OFFICE
CERTIFICATE OF CORRECTION

PATENT NO.        : 8,816,484 B2                                     Page 1 of 1
APPLICATION NO.   : 12/068398
DATED             : August 26, 2014
INVENTOR(S)       : Jun Koyama et al.

It is certified that error appears in the above-identified patent and that said Letters Patent is hereby corrected as shown below:

In the Specification

At column 23, line 43, "YA," should be --YAG,--;

In the Claims

In claim 31, at column 34, line 42, "second," should be --second--.

Signed and Sealed this
Tenth Day of February, 2015

Michelle K. Lee
*Deputy Director of the United States Patent and Trademark Office*